(12) United States Patent
Fang et al.

(10) Patent No.: US 11,211,451 B2
(45) Date of Patent: Dec. 28, 2021

(54) STRETCHABLE ELECTRONIC STRUCTURES AND TECHNIQUES FOR THE FORMATION THEREOF

(71) Applicant: NORTHEASTERN UNIVERSITY, Boston, MA (US)

(72) Inventors: Hui Fang, Brookline, MA (US); Xun Han, Boston, MA (US); Kyung Jin Seo, Boston, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 16/861,520

(22) Filed: Apr. 29, 2020

(65) Prior Publication Data

US 2020/0343340 A1    Oct. 29, 2020

Related U.S. Application Data

(60) Provisional application No. 62/840,008, filed on Apr. 29, 2019.

(51) Int. Cl.
| | |
|---|---|
| *H01L 29/06* | (2006.01) |
| *H01L 29/10* | (2006.01) |
| *H01L 23/528* | (2006.01) |
| *H01L 29/16* | (2006.01) |
| *H01L 29/786* | (2006.01) |

(52) U.S. Cl.
CPC ........ *H01L 29/0665* (2013.01); *H01L 23/528* (2013.01); *H01L 29/1033* (2013.01); *H01L 29/16* (2013.01); *H01L 29/78651* (2013.01)

(58) Field of Classification Search
CPC . H01L 29/0665; H01L 29/1033; H01L 29/16; H01L 29/78651
See application file for complete search history.

(56) References Cited

U.S. PATENT DOCUMENTS

| | | | | |
|---|---|---|---|---|
| 2012/0097204 | A1* | 4/2012 | Yu | H01L 35/26 136/200 |
| 2012/0301953 | A1* | 11/2012 | Duan | G01N 27/4146 435/287.9 |
| 2020/0094466 | A1* | 3/2020 | Vachicouras | B32B 27/281 |

OTHER PUBLICATIONS

Kim, D. H., et al. Dissolvable films of silk fibroin for ultrathin conformal bio-integrated electronics. Nat. Mater. 9(6):511-517 (2010).
Kim, D. H., et al. Epidermal Electronics, Science 333:838-843 (2011).
Schwartz, G., et al. Flexible polymer transistors with high pressure sensitivity for application in electronic skin and health monitoring, Nat. Commun. 4(1859):1-8 (2013).

(Continued)

*Primary Examiner* — Changhyun Yi
(74) *Attorney, Agent, or Firm* — Kacvinsky Daisak Bluni, PLLC

(57) ABSTRACT

Techniques, materials, and structures for stretchable semiconductor nanomesh structures are described. In one embodiment, a stretchable semiconductor nanomesh structure may include a nanomesh formation of certain semiconductor material comprising a network of traces forming at least one opening between sidewalls of the nanomesh formation material, and a substrate configured to support the nanomesh formation material. Other embodiments are described.

20 Claims, 28 Drawing Sheets

(56) References Cited

OTHER PUBLICATIONS

Gao, W., et al. Fully integrated wearable sensor arrays for multiplexed in situ perspilalion analysis. Nature 529(7587):509-514 (2016).
Chortos, A., Liu, J., Bao, Z. A. Pursuing prosthetic electronic skin. Nat. Mater. 15:937-950 (2016).
Do, T. N., Visell, Y. Stretchable, Twisted Conductive Microtubules for Wearable Computing, Robotics, Electronics, and Healthcare. Sci. Rep. 7(1753):1-12 (2017).
Kim, D. H., Ghaffari, R., Lu, N. S., Rogers, J. A. Flexible and Stretchable Electronics for Biointegrated Devices. Annu. Rev. Biomed. Eng. 14:113-128 (2012).
Wagner, S., Bauer, S. Materials for stretchable electronics. MRS Bull 37:207-213 (2012).
Liu, Y., Pharr, M., Salvatore, G. A. Lab-on-Skin: A Review of Flexible and Stretchable Electronics for Wearable Health Monitoring. Acs Nano 11(10):9614-9635 (2017). Abstract.
Hammock, M. L., et al. 25th Anniversary Article: The Evolution of Electronic Skin (ESkin): A Brief History, Design Considerations, and Recent Progress. Adv. Mater. 25(42):5997-6037 (2013). Abstract.
Chou, H. H., et al. A chameleon-inspired stretchable electronic skin with interactive colour changing collrolled by tactile sensing. Nat. Commun. 6(8011):1-10 (2015).
Hua, Q. L., et al. Skin-inspired highly stretchable and conformable matrix networks for multifunctional sensing. Nat. Commun. 9(244)1-11 (2018).
Kim, D. H., et al. Materials for multifunctional balloon catheters with capabilities in cardiac electrophysiological mapping and ablation therapy. Nat. Mater. 10(4):316-323 (2011).
Jeong, J. W., et al. Capacitive Epidermal Electronics for Electrically Safe, Long-Term Electrophysiological Measurements. Adv. Healthc. Mater. 3(5):642-648 (2014).
Fang, H., et al. Capacitively coupled arrays of multiplexed flexible silicon transistors for long-term cardiac electrophysiology. Nat. Biomed. Eng. 1:1-23 (2017).
Imani, S., et al. A wearable chemical-electrophysiological hybrid biosensing system for real-time health and fitness monitoring. Nat. Commun. 7:11650 (2016).
Del Alamo, J. A. Nanometre-scale electronics with III-V compound semiconductors. Nature 479, 317-323 (2011). Abstract.
Dutta, P., et al. High mobility single-crystalline-like GaAs thin films on inexpensive flexible metal substrates by metal-organic chemical vapor deposition. Appl. Phys. Lett. 105:1-5(2014).
Lee, J. S., et al. Band-like transport, high electron mobility and high photoconductivity in all-inorganic nanocrystal arrays. Nat. Nanotechnol. 6, 348-352 (2011).
Khang, D. Y., Jiang, H. Q., Huang, Y., Rogers, J. A. "Stretchable form of single-crystal silicon for high-performance electronics on rubber substrates". Science 311, 208-212 (2006). Abstract.
Choi, W. M., et al. Biaxially stretchable "Wavy" silicon nanomembranes. Nano Lett. 7(6):1655-1663 (2007).
Kim, D. H., et al. Ultrathin Silicon Circuits With Strain-isolation Layers and Mesh Layouts for High-Performance Electronics on Fabric, Vinyl, Leather, and Paper. Adv.Mater. 21(36):3703-3707 (2009).
Xu, S., et al. Stretchable batteries with self-similar serpentine interconnects and integrated wireless recharging systems. Nat. Commun. 4(1543):1-8 (2013).
Sekitani, T., et al. A rubberlike stretchable active matrix using elastic conductors. Science 321(5895):1468-1472 (2008). Abstract.
Graz, I. M., Cotton, D. P. J., Robinson, A., Lacour, S. P. Silicone substrate with in situ strain relief for stretchable thin-film transistors. Appl. Phys. Lett. 98(123101:1-3 (2011).
Kaltenbrunner, M., et al. An ultra-lightweight design for imperceptible plastic electronics. Nature 499:458-465 (2013).
Oh, J. Y., et al. Intrinsically stretchable and healable semiconducting polymer for organic transistors. Nature 539, 411-415 (2016).
Shin, G., et al. Stretchable Field-Effect-Transistor Array of Suspended SnO2 Nanowires. Small 7(9):1181-1185 (2011).
Chae, S. H., et al. Transferred wrinkled Al2O3 for highly stretchable and transparent graphene-carbon nanotube transistors. Nat. Mater. 12:403-409 (2013).
Cai, L., et al. Fully Printed Stretchable Thin-Film Transistors and Integrated Logic Circuits. Acs Nano 10(12):11459-11468 (2016). Abstract.
Sekitani, T., Someya, T. Stretchable, Large-area Organic Electronics. Adv. Mater. 22(20): 2228-2246 (2010). Abstract.
Yao, Y. F., Dong, H. L., Hu, W. P. Charge Transport in Organic and Polymeric Semiconductors for Flexible and Stretchable Devices. Adv. Mater. 28(22):4513-4523 (2016). Abstract.
Qian, Y., et al. Stretchable Organic Semiconductor Devices. Adv. Mater. 28(42): 9243-9265 (2016). Abstract.
Choi, S. J., Bennett, P., Lee, D., Bokor, J. Highly uniform carbon nanotube nanomesh network transistors. Nano Research 8, 1320-1326 (2015).
Chen, B. Y., et al. Highly Uniform Carbon Nanotube Field-Effect Transistors and Medium Scale Integrated Circuits. Nano Lett. 16(8): 5120-5128 (2016) Abstract.
Guo, C. F., et al. Highly stretchable and transparent nanomesh electrodes made by grain boundary lithography. Nat. Commun. 5(3121 ):1-8 (2014).
Guo, C. F., et al. Fatigue-free, superstretchable, transparent, and biocompatible metal electrodes. Proc. Natl. Acad. Sci. U S A 112(40):12332-12337 (2015).
Yu, J. K., et al. Reduction of thermal conductivity in phononic nanomesh structures. Nat. Nanotechnol. 5, 718-721 (2010).
Lee, J., et al. Investigation of phonon coherence and backscattering using silicon nanomeshes. Nat. Commun. 8(14054):1-8 (2017).
Xu, T., et al. Optical absorption of silicon nanowires. J. Appl. Phys. 112:1-26 (2012).
Lin, Y. R., Tsai, W. T., Wu, Y. C., Lin, Y. H. Ultra Thin Poly-Si Nanosheet Junctionless Field-Effect Transistor with Nickel Silicide Contact. Materials 10(1276):1-7 (2017).
Wang, S. D., et al. Local versus global buckling of thin films on elastomeric substrates. Appl. Phys. Lett. 93:1-3 (2008).
Zhang, Y. H., et al. Experimental and Theoretical Studies of Serpentine Microstructures Bonded To Prestrained Elastomers for Stretchable Electronics. Adv. Funct. Mater. 24, 2028-2037 (2014).
Freund, L. B., Suresh, S. Thin Film Materials: Stress, Defect Formation and Surface Evolution 1st Ed. (Cambridge University Press: Cambridge, U.K., 2003). Abstract.
Ando, T., et al. Orientation-dependent fracture strain in single-crystal silicon beams under uniaxial tensile conditions. Mhs97: Proceedings of 1997 International Symposium on Micromechatronics and Human Science, 55-60 (1997). Abstract.
Jang, K. I., et al. Soft network composite materials with deterministic and bio-inspired designs. Nat. Commun. 6(6566):1-11 (2015).
Fan, J. A., et al. Fractal design concepts for stretchable electronics. Nat. Commun. 5(3266):1-8 (2014).
Rojas, J. P., Arevalo, A., Foulds, I. G., Hussain, M. M. Design and characterization of ultra-stretchable monolithic silicon fabric. Appl. Phys. Lett. 105:15410-1 through 154101-5(2014).
Alcheikh, N., Shaikh, S. F., Hussain, M. M. Ultra-stretchable Archimedean interconnects for stretchable electronics. Extreme Mech. Lett. 24:6-13 (2018).
Mack, S., et al. Mechanically flexible thin-film transistors that use ultrathin ribbons of silicon derived from bulk wafers. Appl. Phys. Lett. 88: 213101-1 through 213101-3(2006).

\* cited by examiner

STRETCHABLE ELECTRONIC STRUCTURES AND TECHNIQUES FOR THE FORMATION THEREOF

CROSS-REFERENCE TO RELATED APPLICATIONS

This application claims priority to U.S. Provisional Patent Application Ser. No. 62/840,008, filed on Apr. 29, 2019, entitled "Stretchable Electronic Structures," the content of which is incorporated herein by reference.

TECHNICAL FIELD

Embodiments herein generally relate to stretchable electronic structures and, in particular, to stretchable semiconductor nanomesh materials.

BACKGROUND

Stretchable or flexible electronics have emerged as a promising platform for many nascent technologies, such as bio-mimetics, health monitoring, biomedical therapeutics, and soft robotics. Due to their low modulus, stretchable devices may serve as artificial electronic organs (for instance, for robotics or prosthetics) or form more conformal and compatible interfaces with irregular, shape-evolving, or soft objects (for instance, for more comfortably-fitting wearable devices). For example, applications include electronic skin demonstrations from various stretchable active matrices and multifunctional balloon catheters for cardiac electrophysiological mapping and ablation therapy.

Core material elements in conventional high-performance electronics are typically inorganic single crystals such as silicon (Si) or compound semiconductors. However, these materials are usually rigid. Techniques have been developed that have made these semiconductors in thin film structures that render them somewhat flexible, but they are still too brittle and are not able to provide performance metrics necessary to achieve viable stretchable devices.

Conventional attempts at forming stretchable devices have included designing microstructural layouts in standard materials, for example, by configuring inorganic semiconductor based circuits into microscale island-bridge layout. However, microscale structuring lacks the high-density advantage required in modern microelectronics, for example, which has been exploited to achieve advances that comply with Moore's law. Another attempt involves developing intrinsically stretchable components such as organic semiconductors and nano-wire or -tube networks. However, such semiconductors currently are still quite limited in their mobility and/or reliability, with limited electron mobility (for instance, less than 10 $cm^2/V \cdot s$), while bottom up assembled networks such as carbon nanotube webs are also limited by their uniformity. Accordingly, existing approaches are not able to achieve high-density, high-performance stretchable electronic elements required to meet the current needs of developers.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In accordance with various aspects of the described embodiments is a stretchable nanomesh structure that may include a nanomesh formation material having a network of traces forming at least one opening between sidewalls of the nanomesh formation material, and a substrate configured to support the nanomesh formation material.

In accordance with various aspects of the described embodiments is a stretchable semiconductor nanomesh structure that may include a nanomesh formation material of semiconductor material having a network of traces forming at least one opening between sidewalls of the nanomesh formation material, and a substrate configured to support the nanomesh formation material.

In some embodiments of the stretchable semiconductor nanomesh structure, the nanomesh formation material may include silicon (Si). In some embodiments of the stretchable semiconductor nanomesh structure, the nanomesh formation material may include an optoelectronic semiconductor material. In some embodiments of the stretchable semiconductor nanomesh structure, the nanomesh formation material may include one of gallium or gallium nitride. In some embodiments of the stretchable semiconductor nanomesh structure, the nanomesh formation material may include germanium (Ge). In some embodiments of the stretchable semiconductor nanomesh structure, the nanomesh formation material may include a piezoelectric material. In some embodiments of the stretchable semiconductor nanomesh structure, the nanomesh formation material may include one or all of lead (Pb), zirconate, or titanate. In some embodiments of the stretchable semiconductor nanomesh structure, the nanomesh formation material may include Si, Ga, Ge, Pb, zirconate, titanate, combinations thereof, and/or alloys thereof. In some embodiments of the stretchable semiconductor nanomesh structure, the nanomesh formation material the substrate may include an elastomer material. In some embodiments of the stretchable semiconductor nanomesh structure, the elastomer material may include Polydimethylsiloxane (PDMS).

In various embodiments of the stretchable semiconductor nanomesh structure, the nanomesh formation material may include a bilayer nanomesh material that may include Polyimide (PI). In various embodiments of the stretchable semiconductor nanomesh structure, the nanomesh formation material may include a bilayer nanomesh material formed of silicon (Si) and Polyimide (PI). In various embodiments of the stretchable semiconductor nanomesh structure, the nanomesh formation material may include a bilayer nanomesh material formed of Polyimide (PI) and at least one of a semiconductor material, silicon (Si), an optoelectronic semiconductor material, gallium (Ga), Ga nitride, germanium (Ge), a piezoelectric material, and/or one or all of lead (Pb), zirconate, or titanate.

In various embodiments of the stretchable semiconductor nanomesh structure, the network of traces may be formed of a web of fully connected sidewalls. In some embodiments of the stretchable semiconductor nanomesh structure, the nanomesh formation material having a fill factor defined by an occupation percentage of the nanomesh formation material over a defined area, the fill factor less than about 100%. In various embodiments of the stretchable semiconductor nanomesh structure, the fill factor being about 30% to about 55%. In exemplary embodiments of the stretchable semiconductor nanomesh structure, the stretchable nanomesh structure having an electron mobility of greater than 10 cm2/V·s to about 50 cm2/V·s. In some embodiments of the stretchable semiconductor nanomesh structure, the stretchable nanomesh structure having a one-time stretchability of up to about 25% strain. In various embodiments of the stretchable semiconductor nanomesh structure, the stretchable nanomesh structure having cyclic stretchability with less than 10% fatigue after 1000 stretching cycles with a constant strain of 14%.

In accordance with various aspects of the described embodiments is an electronic device that may include a stretchable nanomesh structure to provide at least one electrical function for the electronic device. The stretchable nanomesh structure may include a nanomesh formation material comprising a network of traces forming at least one opening between sidewalls of the nanomesh formation material, and a substrate configured to support the nanomesh formation material; and an electrical component operably coupled to the stretchable nanomesh structure.

In accordance with various aspects of the described embodiments is an electronic device that may include a stretchable semiconductor nanomesh structure to provide at least one electrical function for the electronic device. The stretchable nanomesh structure may include a nanomesh formation material comprising a network of traces forming at least one opening between sidewalls of the nanomesh formation material, and a substrate configured to support the nanomesh formation material; and an electrical component operably coupled to the stretchable nanomesh structure.

In some embodiments of the electronic device, the nanomesh formation material may include silicon (Si). In some embodiments of the electronic device, the nanomesh formation material may include an optoelectronic semiconductor material. In some embodiments of the electronic device, the nanomesh formation material may include one of gallium or gallium nitride. In some embodiments of the electronic device, the nanomesh formation material may include germanium (Ge). In some embodiments of the electronic device, the nanomesh formation material may include a piezoelectric material. In some embodiments of the electronic device, the nanomesh formation material may include one or all of lead (Pb), zirconate, or titanate. In some embodiments of the electronic device, the nanomesh formation material may include a semiconductor material, Si, Ga, Ge, Pb, zirconate, titanate, combinations thereof, and/or alloys thereof.

In some embodiments of the electronic device, the nanomesh formation material the substrate may include an elastomer material. In some embodiments of the electronic device, the elastomer material may include Polydimethylsiloxane (PDMS).

In various embodiments of the electronic device, the nanomesh formation material may include a bilayer nanomesh material that may include Polyimide (PI). In various embodiments of the electronic device, the nanomesh formation material may include a bilayer nanomesh material formed of silicon (Si) and Polyimide (PI). In various embodiments of the electronic device, the nanomesh formation material may include a bilayer nanomesh material formed of Polyimide (PI) and at least one of a semiconductor material, silicon (Si), an optoelectronic semiconductor material, gallium (Ga), Ga nitride, germanium (Ge), a piezoelectric material, and/or one or all of lead (Pb), zirconate, or titanate.

In some embodiments of the electronic device, the nanomesh formation material having a fill factor defined by an occupation percentage of the nanomesh formation material over a defined area, the fill factor less than about 100%. In various embodiments of the electronic device, the fill factor being about 30% to about 55%. In exemplary embodiments of the electronic device, the stretchable nanomesh structure having an electron mobility of greater than 10 $cm^2/V\cdot s$ to about 50 $cm^2/V\cdot s$. In some embodiments of the electronic device, the stretchable nanomesh may be used to form a transistor. In various embodiments of the electronic device, the electronic device may be or may include at least one of a bio-mimetic device, a health monitoring device, a wearable device, a sensor, or a soft robotic device.

In accordance with various aspects of the described embodiments is a method of forming a stretchable nanomesh structure. The method may include obtaining a nanomesh starting material on a support, generating nanomeshes by performing lithography and dry etching on the nanomesh starting material, spin coating the nanomeshes with a support layer, performing buried oxide (BOX) layer etching, picking up the spin coated nanomeshes from the support, patterning the support layer based on the nanomeshes to form a bilayer nanomesh structure.

In some embodiments of the method, the nanomesh starting material may include silicon (Si). In various embodiments of the method, the nanomesh starting material may include a silicon (Si)-on-insulator (SOI) material. In various embodiments, the support layer may include Polyimide (PI). In some embodiments of the method, lithography may include indium (In) grain boundary lithography or modified In gran boundary lithography. In some embodiments of the method, patterning the support layer based on the nanomeshes to form a bilayer nanomesh structure may include one of etching, dots-per-inch (DPI) etching, or laser etching. In various embodiments of the method, the nanomesh starting material may include at least one of a semiconductor material, silicon (Si), an optoelectronic semiconductor material, gallium (Ga), Ga nitride, germanium (Ge), a piezoelectric material, and/or one or all of lead (Pb), zirconate, or titanate. In some embodiments of the method, the nanomesh starting material may include one or all of lead, zirconate, or titanate. In some embodiments of the electronic device, the nanomesh starting material may include a semiconductor material, Si, Ga, Ge, Pb, zirconate, titanate, combinations thereof, and/or alloys thereof.

Figure 1A:
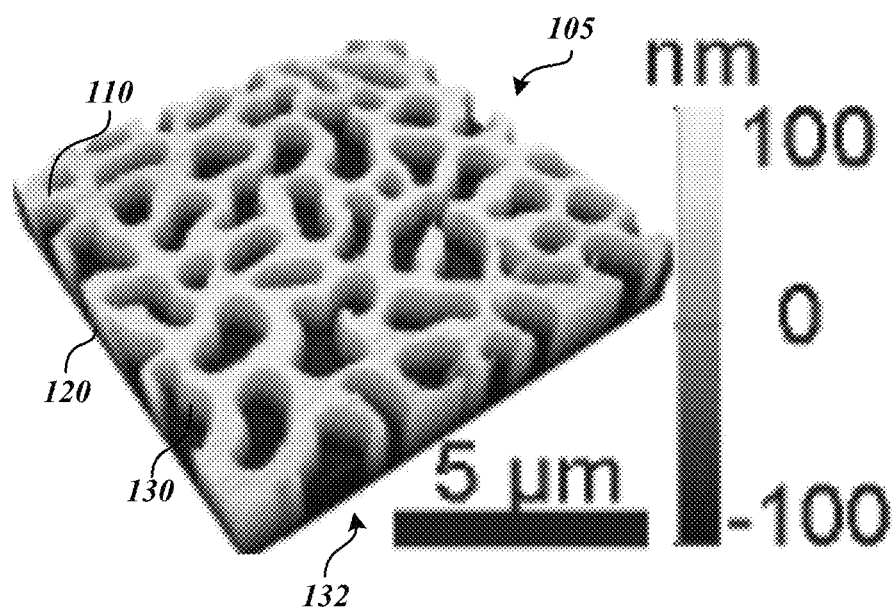
FIG. 1A depicts an atomic force microscope (AFM) image a silicon (Si) nanomesh according to some embodiments.

The drawings are not necessarily to scale. The drawings are merely representations, not intended to portray specific parameters of the disclosure. The drawings are intended to depict example embodiments of the disclosure, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Various embodiments may generally be directed toward stretchable or flexible nanomesh materials (a "nanomesh," a "nanomesh material," a "nanomesh formation material," a "nanomesh structure," an "Si nanomesh," "nanomesh film," and/or a "nanomesh element" may be used interchangeably herein) and techniques for forming stretchable nanomesh materials. In some embodiments, the stretchable nanomesh materials may include bilayer nanomesh materials. In exemplary embodiments, the stretchable nanomesh materials may be or may be used to form electrical components or structures, including, without limitation, semiconductors, transistors, electrodes, microelectrodes, microelectrode arrays, and/or wafer-scale nanomeshes.

In some embodiments, a nanomesh may be or may include a dense network of fully connected, high quality, spring-like inorganic semiconductor traces of nanoscale line width. For example, in some embodiments, nanomeshes may be formed of silicon (Si), for instance, from a lift-off and transfer process. Pattern shape and trace width of the nanomesh structures can be formed by applying different soft lithography methods such as E-beam lithography, indium (In) grain boundary lithography, stepper lithography, and/or the like. In some embodiments, a nanomesh structure may be or may include a bilayer nanomesh structure (Si/polyimide (PI)) configured, for example, to further improve nanomesh stretchability. Nanomesh semiconductors may provide a unique and promising pathway towards high density, high performance stretchable microelectronics.

Conventional attempts at stretchable semiconductors may utilize a microscale island-bridge layout and microscale semiconductor ribbons. Both of these methods involve out-of-plane design which can be limited for applications that require contact and conformality. Furthermore, microscale structuring often lacks the high-density advantage required of modern microelectronics. Nanomesh structures according to some embodiments, for instance Si/PI bilayer nanomeshes, may provide a previously unmet combination of all desired features for stretchable semiconductor, including in-plane structure and high density. Other conventional techniques for developing stretchable semiconductors center in developing intrinsically stretchable organic semiconductors. However, organic semiconductors currently are limited in their mobility and/or reliability, for example, with typical electron mobility still less than 10 $cm^2/V \cdot s$. Additional conventional stretchable semiconductors focus on one dimensional semiconducting networks, such as carbon nanotubes. However, carbon nanotube webs are limited by their uniformity with the coexistence of both metallic and semiconducting nanotubes.

Nanomesh structures according to some embodiments may provide multiple technological advantages over conventional attempts at stretchable electronic components. In one non-limiting example of a technological advantage, semiconductor nanomesh structures according to some embodiments may provide a new platform for materials engineering and is expected to yield a new family of stretchable inorganic materials having, among other things, tunable electronic and optoelectronic properties with customized nanostructures. In another non-limiting example of a technological advantage, Si nanomesh structures according to some embodiments may provide stretchable material by making a Si film into homogeneous nanomeshes with a high electron mobility (e.g., 50 $cm^2/V \cdot s$) and stretchability (e.g., with a one-time strain of 25% and cyclic strain of 14% after stretching for 1000 cycles) simultaneously, compared with conventional techniques. In a further non-limiting technological advantage, nanomesh structures according to some embodiments may be used to implement the electronic functionality of microelectronic devices, for example, providing for high density, high performance stretchable electronics and microelectronics.

Accordingly, stretchable semiconductor nanomesh structures according to some embodiments may be used to provide high density and high performance stretchable electronic devices. Potential uses may include, without limitation, stretchable semiconductor nanomesh structures for electronic anatomical structures (e.g., organs, skin, and/or the like), stretchable semiconductor nanomesh for wearable devices, stretchable semiconductor nanomesh for robotics, stretchable semiconductor nanomesh for health monitoring, stretchable semiconductor nanomesh for stretchable display, wearable devices, and/or the like. Embodiments are not limited in this context.

In this description, numerous specific details, such as component and system configurations, may be set forth in order to provide a more thorough understanding of the described embodiments. It will be appreciated, however, by one skilled in the art, that the described embodiments may be practiced without such specific details. Additionally, some well-known structures, elements, and other features have not been shown in detail, to avoid unnecessarily obscuring the described embodiments.

In the following description, references to "one embodiment," "an embodiment," "example embodiment," "various embodiments," etc., indicate that the embodiment(s) of the technology so described may include particular features, structures, or characteristics, but more than one embodiment may and not every embodiment necessarily does include the particular features, structures, or characteristics. Further, some embodiments may have some, all, or none of the features described for other embodiments.

As used in this description and the claims and unless otherwise specified, the use of the ordinal adjectives "first," "second," "third," etc. to describe an element merely indicate that a particular instance of an element or different instances of like elements are being referred to, and is not intended to imply that the elements so described must be in a particular sequence, either temporally, spatially, in ranking, or in any other manner.

Figure 1B:
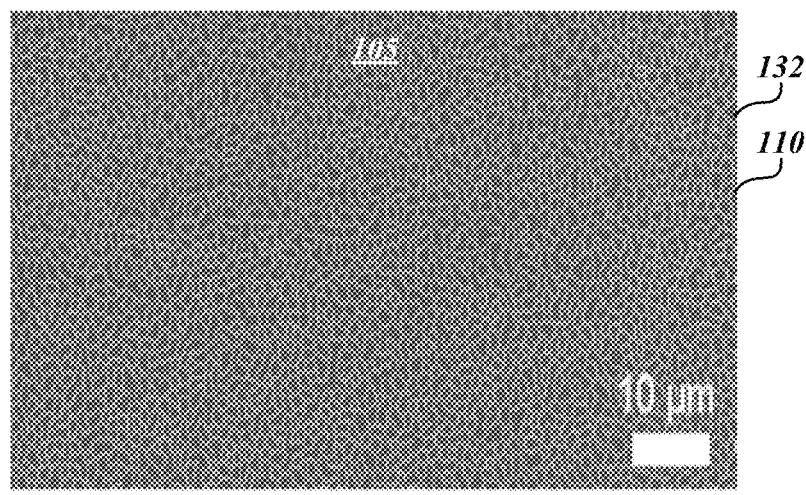
FIG. 1B depicts a scanning electron microscope (SEM) image of a Si nanomesh film according to some embodiments.
Figure 1C:
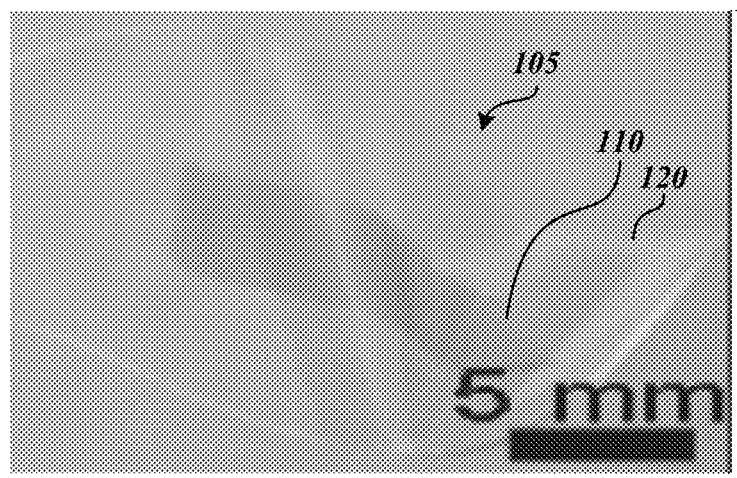
FIG. 1C depicts a stretchable Si nanomesh film on an elastomer substrate according to some embodiments.

FIGS. 1A-1C depict semiconductor nanomesh structures according to some examples. More specifically, FIG. 1A depicts an atomic force microscope (AFM) image of a silicon (SI) nanomesh structure according to some embodiments, FIG. 1B depicts a scanning electron microscope (SEM) image of a nanomesh film according to some embodiments, and FIG. 1C depicts a stretchable nanomesh film on an elastomer substrate (for example, a PDMS substrate) according to some embodiments.

In some embodiments, nanomesh structures 105 may be formed from thin, curvilinear nano-traces of single-crystalline Si densely connected with each other, that may be bonded onto Polydimethylsiloxane (PDMS) or other elastomer substrates, for instance, with Si—O chemical bonding for mechanical support. The mechanical, electrical and other properties of Si nanomeshes 105 may be determined by the properties of Si itself and the structure of the nanomeshes. Referring to FIGS. 1A and 1B, nanomesh structures 105 may include nanomesh materials or films (nanomesh formation material or nanomesh) 110 arranged on a substrate 120. In some embodiments, nanomesh formation material 110 may include Si or Si/PI materials. In various embodiments, substrate 120 may be or may include PDMS. In some embodiments, nanomesh materials 110 may be formed of walls or sidewalls 130 of a nanomesh forming material (for instance, formed of Si or Si/PI) and openings or spaces 132 between sidewalls 130, to form a web-like structure of the nanomesh forming material. Nanomesh structures 105 may be formed at centimeter (cm), millimeter (mm), nanometer (nm), and/or micrometer (μm) scales with high uniformity and without any missing traces. Spring-like traces of nanomesh structures 105 may be deformed to accommodate the applied strain which makes the nanomesh network stretchable. In some embodiments, an additional PI layer may exist under the Si, forming a bilayer nanomesh, further providing mechanical support.

Figure 2:
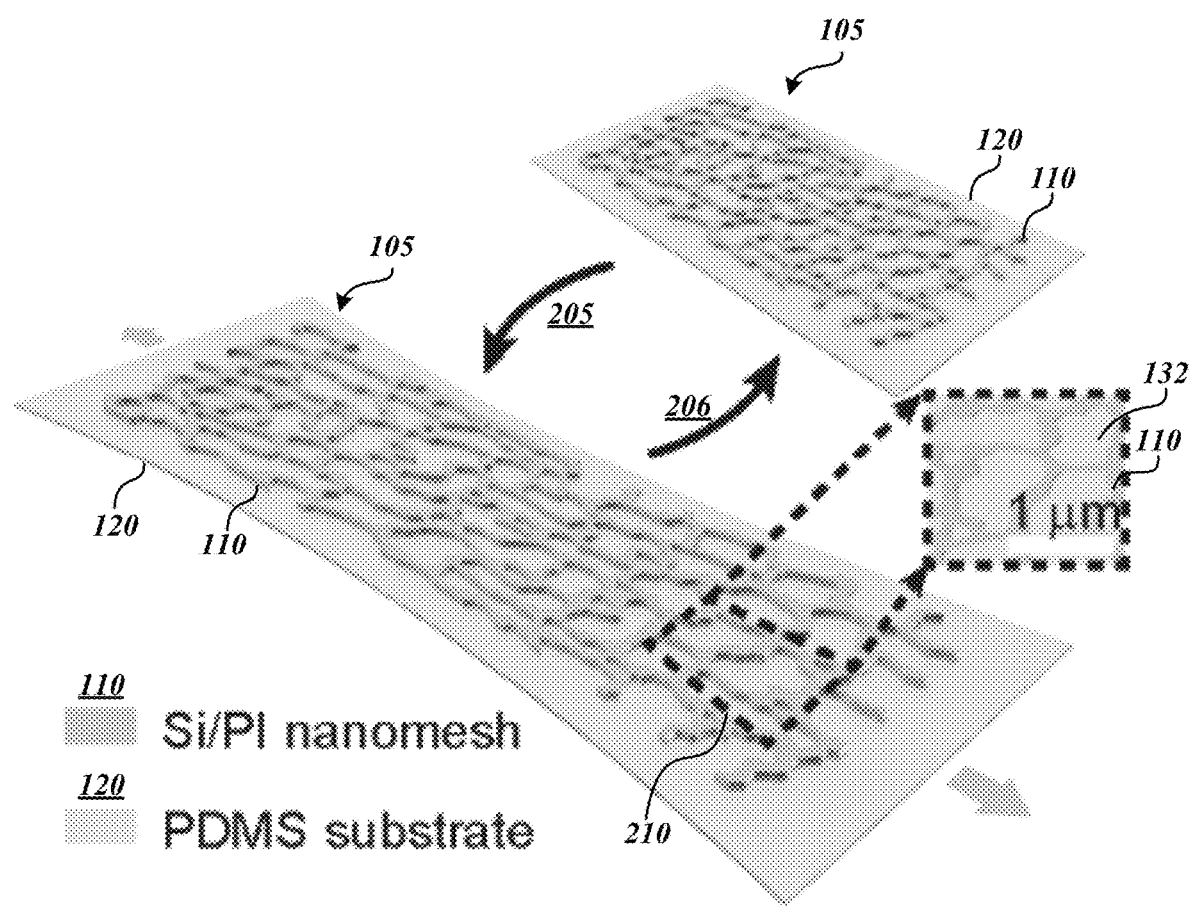
FIG. 2 depicts a schematic illustration of stretchable Si/Polyimide (PI) bilayer nanomeshes on an elastomer substrate according to some embodiments.

FIG. 2 depicts a schematic illustration of a stretchable nanomesh structure 105 formed of Si/PI bilayer nanomeshes 110 on an elastomer substrate 120 according to some embodiments. In some embodiments, substrate 120 may be or may include PDMS. As shown in FIG. 2, nanomesh structure 105 is capable of stretching 205 and relaxing 206, for example, to original dimensions. Inset 210 shows details of sidewalls 130 (for instance, the vertical edges of nanomesh material 110) and openings 132 (for instance, open areas within nanomeshes 110, between sidewalls 130).

Figure 3:
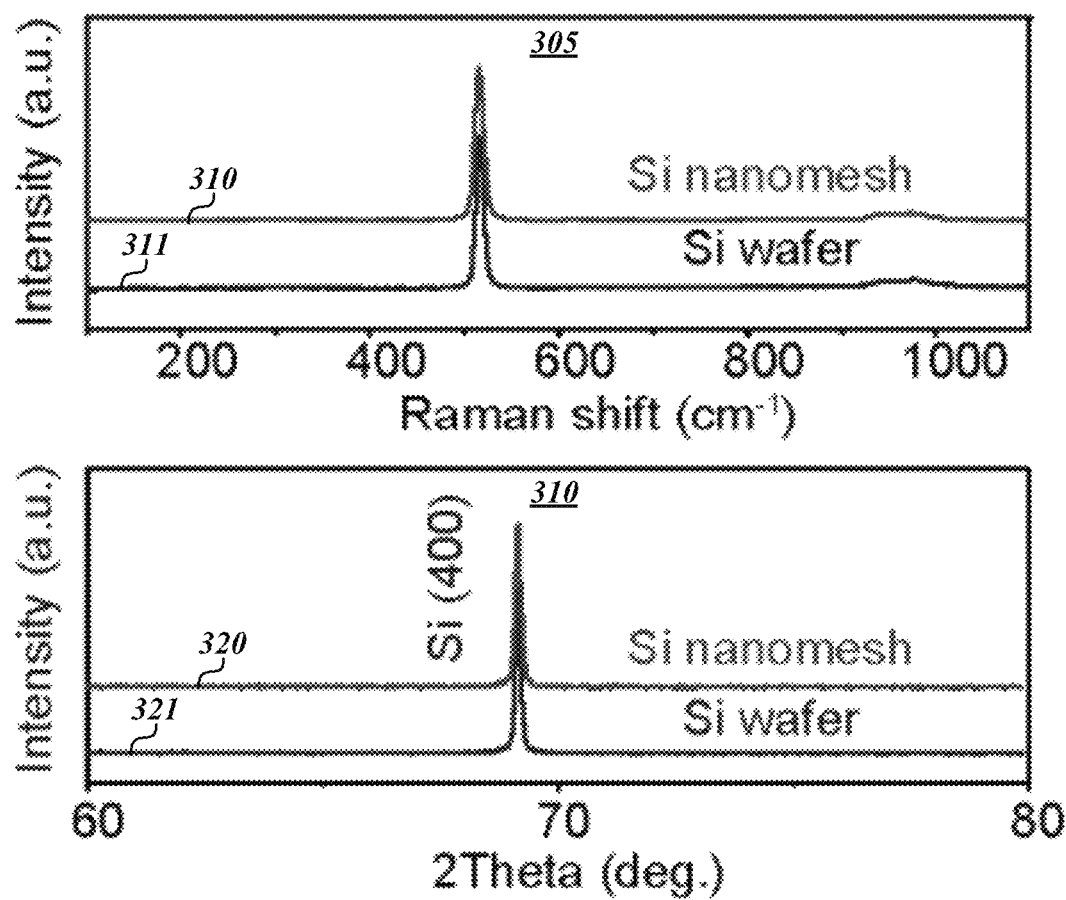
FIG. 3 depicts graphs of Raman spectra and X-ray diffraction patterns for Si nanomeshes and Si wafers according to some embodiments.

FIG. 3 depicts graphs of Raman spectra and X-ray diffraction patterns for Si nanomeshes and Si wafers according to some embodiments. More specifically, FIG. 3 depicts graph 305 of Raman spectra of Si nanomeshes 310 and Si wafers (single-crystalline Si (sc-Si)) 311 and graph 310 of X-ray diffraction of Si nanomeshes 320 and sc-Si wafers 321. Graphs 305 and 310 may show, among other things, the single crystalline nature of Si traces. The transverse optical (TO) Raman peak in graph 305 is observed at 520 cm$^{-1}$, which is in good agreement with sc-Si. X-ray diffraction (XRD) characterization of graph 310 shows that Si nanomeshes also have the same strong and sharp diffraction peak from the (400) plane of Si as sc-Si with comparable values of full width at half maximum (FWHM) of 0.16° for Si nanomeshes and 0.12° for Si wafer. The XRD and Raman results confirm the single-crystalline nature of the Si nanomesh traces, which is critical to achieving superior carrier transport properties.

Figure 4:
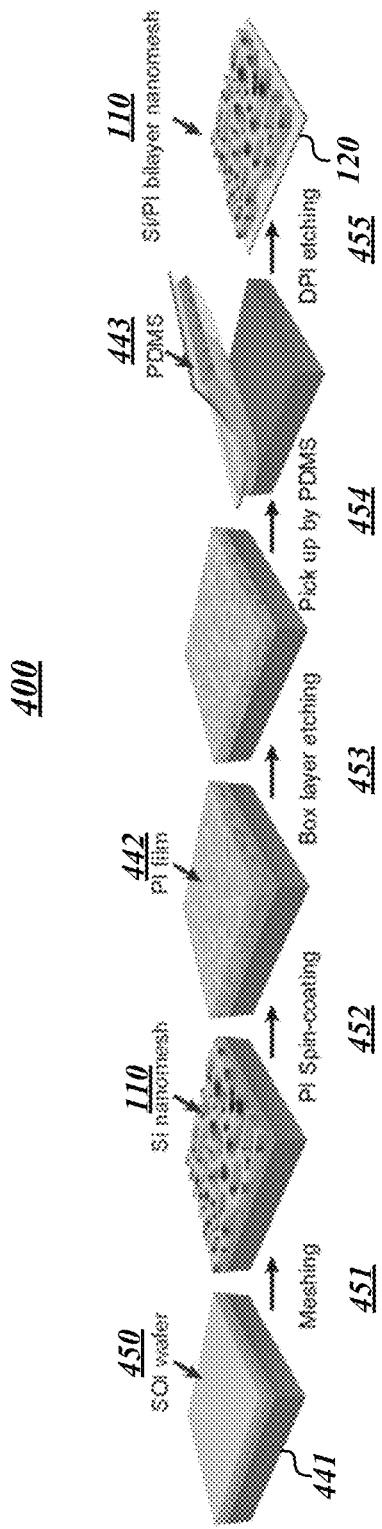
FIG. 4 depicts a schematic illustration of a fabrication process to achieve stretchable semiconductor nanomeshes according to some embodiments.

FIG. 4 depicts a schematic illustration of a fabrication process to achieve stretchable semiconductor nanomeshes according to some embodiments. In some embodiments, nanomesh structures may be formed by nanomesh fabrication process 400 that may starts by cleaning 450 an Si layer on a Si-on-insulator (SOI) wafer 441 (a nanomesh starting material), meshing 451 into nanomeshes 110, for example, from a modified In grain boundary lithography and dry etching process, buried oxide (BOX) layer etching 453, and picking up by PDMS 454. In some embodiments, an ultrathin PI film 442 may secure the nanomeshes during the wet etching of the buried oxide (BOX) layer. After PI spin coating 452, picking up by PDMS 443, patterning the PI film 455 using Si nanomeshes as a self-aligned mask may complete the formation of Si/PI bilayer nanomeshes. Although Si and SOI materials are described in this formation process, embodiments are not so limited, as other starting materials may be used to form nanomesh structures formed of different components (such as gallium, gallium nitride, and/or the like).

In various embodiments, to fabricate stretchable Si nanomeshes, a nanomesh fabrication process may pattern an Si film into nanomeshes in the SOI source wafer, then transfer them onto a PDMS substrate. In some embodiments, the nanomesh formation process may use a modified In grain boundary lithography method as an exemplary, large-scale, soft lithography approach to form the Si nanomesh pattern. In various embodiments, the nanomesh fabrication process may utilize self-formed In grain boundaries to achieve Cr nanomeshes on the source SOI wafer (Si thickness, $t_{Si}$=145 nm), followed by Si dry etching with chromium (Cr) nanomeshes as the mask (see, for example, FIG. 13). Removal of Cr completes the fabrication of Si nanomeshes in the SOI wafer. After the Si nanomesh formation in the SOI wafer, a simple transfer process achieves freely stretching Si nanomeshes onto PDMS substrates. An ultrathin PI layer secures the Si nanomeshes during the transfer process. After being picked by PDMS substrate, the PI layer may be patterned by using Si nanomeshes as a self-aligned mask. The PI layer finally forms a bilayer nanomesh structure with Si, providing additional support for the Si nanomeshes during mechanical deformation. Although Si, PI, PDMS, and Cr are used in some examples in the present disclosure, nanomesh fabrication process according to some embodiments may be applicable to a variety of other semiconductors and inorganic materials.

Figure 5:
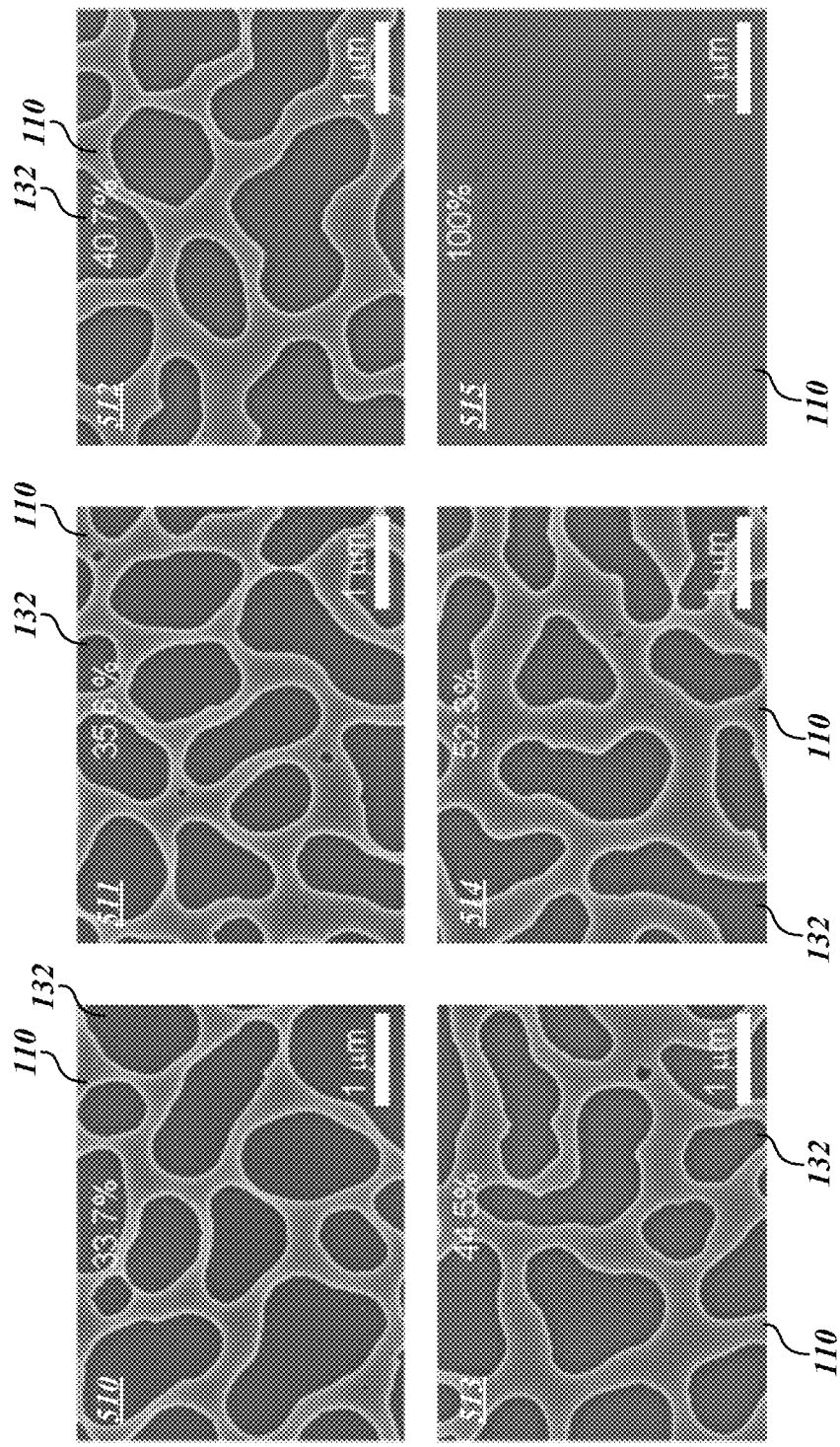
FIG. 5 depicts SEM images of Si nanomeshes with different fill factors according to some embodiments.

FIG. 5 depicts SEM images of Si nanomeshes with different fill factors according to some embodiments. In some embodiments, trace widths of Si nanomeshes can be tailored from nanomesh fabrication processes according to some embodiments (see also, for example, FIG. 14). FIG. 5 depicts nanomeshes 510-515 having different trace widths and fill factors of nanomesh material 110 and openings 132. In some embodiments, the fill factor may be defined by the occupation percentage of the nanomesh formation material (for instance, Si) in the nanomeshes over a given microscale area, for instance, 10×10 μm. Non-limiting examples of fill factors may include 33.7% 510, 35.6% 511, 40.7% 512, 44.5% 513, 52.3% 514, and 100% 515 (full Si fill). In some embodiments, the fill factor may be about 1%, about 5%, about 10%, about 15%, about 20%, about 25%, about 30%, about 35%, about 40%, about 45%, about 50%, about 55%, about 60%, about 65%, about 70%, about 75%, about 80%, about 85%, about 90%, about 95%, about 100%, and any value or range between any two of these values (including endpoints). In some embodiments, nanomesh openings 132 may be formed of various shapes, including circular ("circular nanomeshes") (see, for example, FIG. 15).

Figure 6:
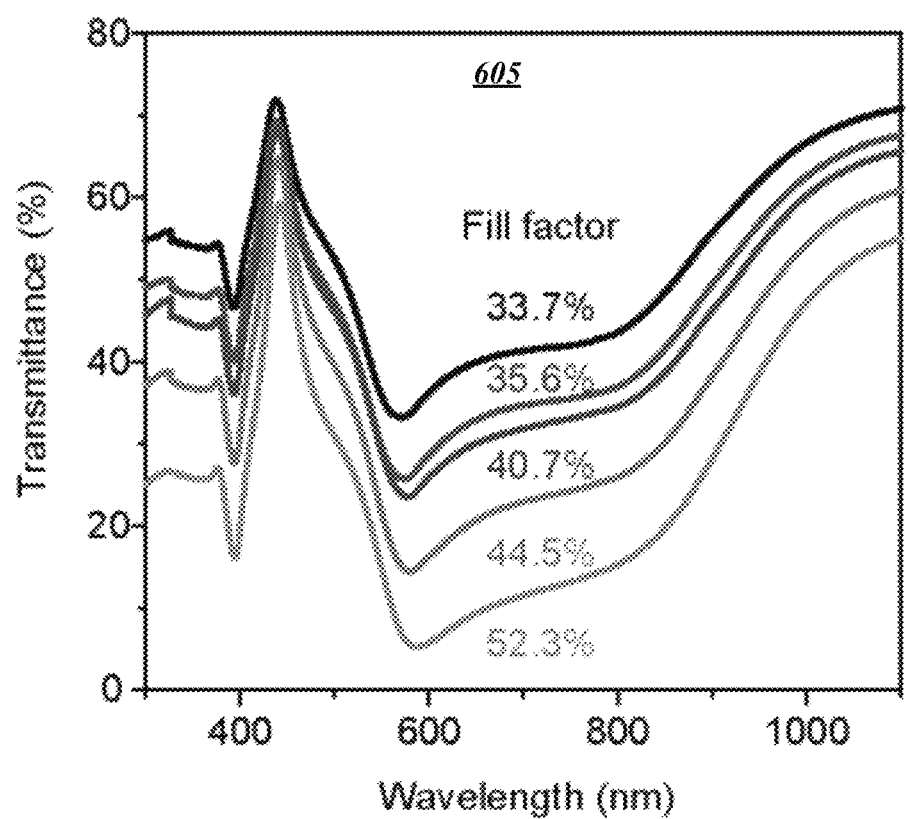
FIG. 6 depicts a graph of transmittance spectra of Si nanomeshes with different fill factors according to some embodiments.

Nanomesh structures according to some embodiments may have various characteristics, including, without limitation, certain optical properties. FIG. 6 depicts a graph of transmittance spectra of Si nanomeshes with different fill factors according to some embodiments. As shown in FIG. 6, graph 605 plots transmittance spectra of Si nanomeshes with different fill factors in the wavelength ranging from 300 to 1100 nm. There are two prominent trends as the fill factor changes. First, as expected, the transmittance increases as the fill factor decreases, since there is less Si to absorb light. As a result, the transmittance of Si nanomeshes with the fill factor of 33.7% is larger than 35% over the entire measurement window. Compared to the transmittance spectra of a Si full film transferred from the same SOI wafer (see, for example, FIG. 16), transmittance through Si nanomeshes in certain wavelength regimes is lower, largely owing to the larger reflection from the textured surface of the nanomeshes. Secondly, both the absorption peak at 400 nm and 600 nm show blue shifts with decreasing fill factor. This phenomenon may be due to, among other things, the change of the volume modes of the Si trace dielectric waveguides. Indeed, previous theoretical and experimental studies on Si nanowires reveal that the wavelength A of the photonic modes in the nanowires scale proportionally with their diameter d, with the position of the absorption peaks all moving to high energies when decreasing the nanowire diameter. From a certain perspective, Si nanomeshes may be regarded as a network of nanoscale traces which are similar to nanowires. The exact relationship between A and the trace width may be determined for nanomeshes according to some embodiments by considering, among other things, the large variation in the trace width (see, for example, graph 1405 of FIG. 14), as well as the curvilinear nature of the nanoscale traces. However, the shift directions are the same between nanomeshes and nanowire arrays. Transmittance results of circular nanomesh (see, for example, FIG. 17) reveals similar trends.

Figure 7:
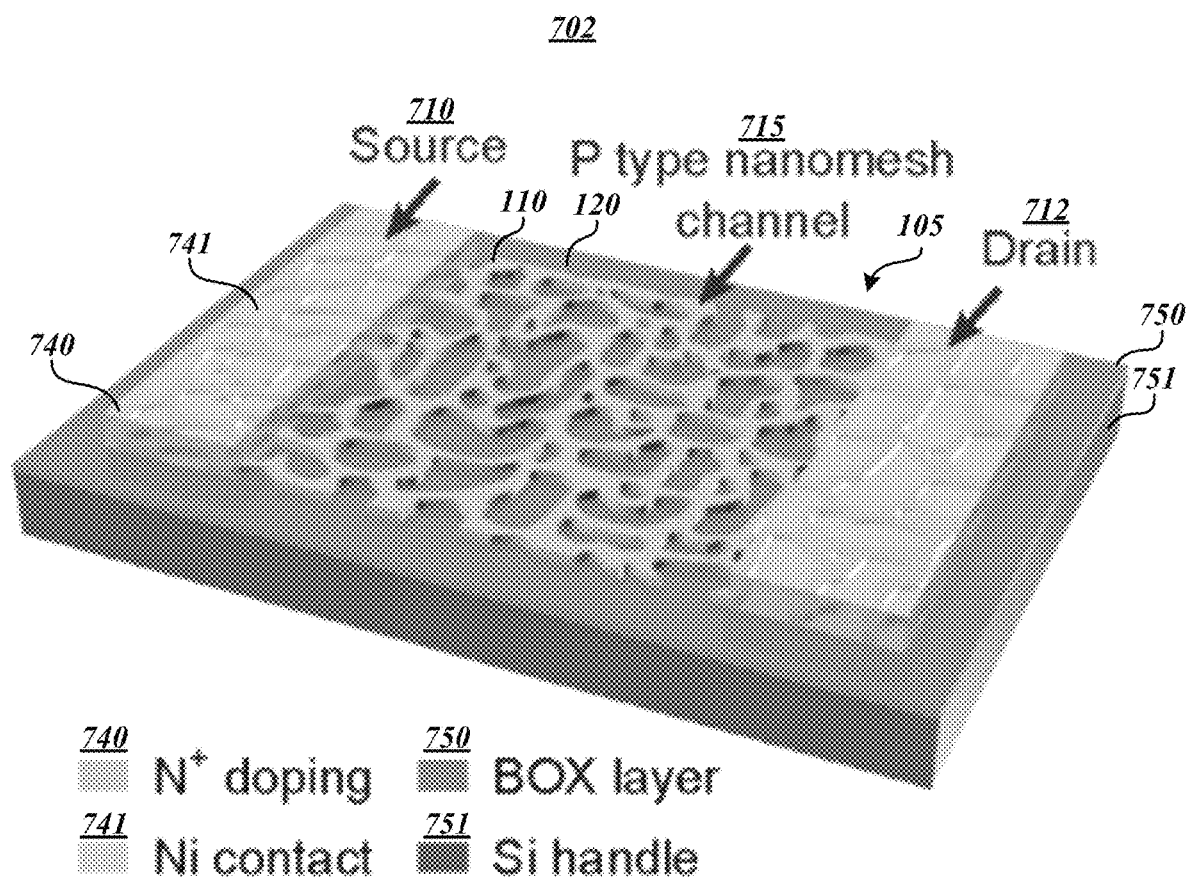
FIG. 7 depicts a nanomesh transistor according to some embodiments.

FIG. 7 depicts a nanomesh transistor according to some embodiments. As shown in FIG. 7, a nanomesh transistor 702 may include a nanomesh structure 105 operably coupled to a source 710 and a drain 712. In various embodiments, nanomesh structure 105 may include at least one p-type nanomesh channel 715. Transistor 702 may include a BOX layer 750 and Si handle 751. Source 710 and drain 712 may include $N^+$ doping 740 and a nickel (Ni) contact 741.

Transistor 702 may be used, inter alia, to study the carrier transport properties of Si nanomeshes according to some embodiments. For example, transistor 702 may be fabricated as an N-channel metal-oxide-semiconductor (NMOS) transistors based on Si nanomeshes. In various embodiments, devices such as transistor 702 may be made and studied on an SOI source wafer for easy gating while still revealing nanomesh properties.

In various embodiments, a nanomesh transistor (such as transistor 702) may have the source and drain nickel (Ni) contacted Si parts be heavily n-type doped and the channel lightly p-type doped. Gate voltage may be applied from the Si handle wafer with the 120-nm-thick BOX layer as the gate dielectric. The sheet resistance and contact resistance of the Si nanomesh transistor may be about 29.05 kΩ/sq and about 2.16 kΩ, respectively, which are calculated through the transmission line measurement (see, for example, FIG. 18).

Figure 8:
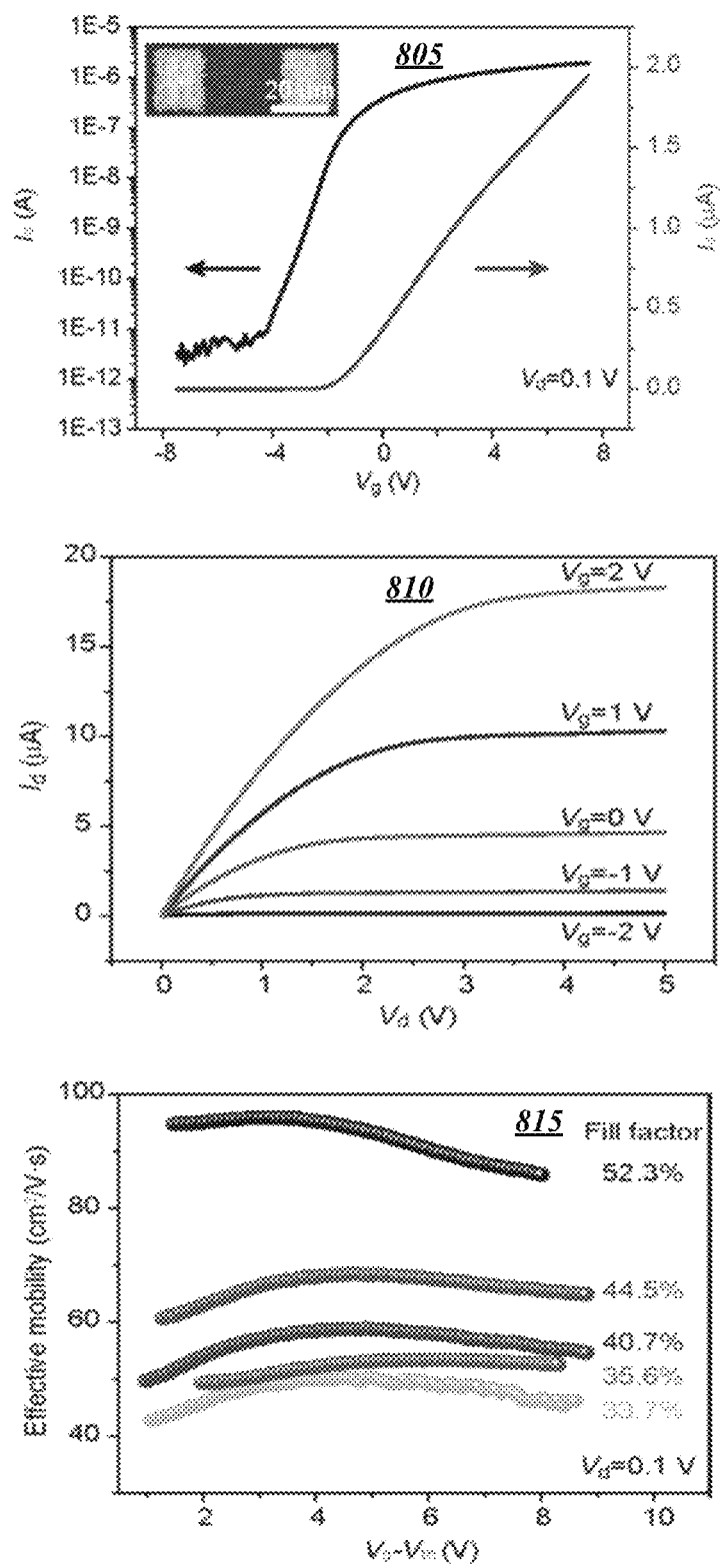
FIG. 8 depicts graphs of transfer characteristics, output characteristics, and mobility characteristics of Si nanomesh transistors according to some embodiments.

FIG. 8 depicts graphs of transfer characteristics, output characteristics, and mobility characteristics of Si nanomesh transistors according to some embodiments. The results depicted in graphs 805, 810, and 815 are similar to previous poly-Si nanosheet transistors with nickel silicide contact after channel width normalization. In general, graph 805 depicts transfer characteristics of an Si nanomesh transistor according to some embodiment with 5a 2.3% fill factor on a log scale (left y-axis) and a linear scale (right y-axis) at a drain voltage of 0.1 V. The channel width and length are 35 μm and 40 μm, respectively (for the optical image of a nanomesh structure according to some embodiments. Referring to graph 805, the transfer characteristics of a Si-nanomesh (52.3% fill factor) transistor (channel length L=40 μm, width W=35 μm) exhibit a clear NMOS switching behavior, with a high ON/OFF current ratio ($I_{ON}/I_{OFF}$) of over $10^5$.

Graph 810 depicts output characteristics of the nanomesh structure plotted in graph 815 at gate voltages from −2 V (bottom) to 2 V (top). Above the threshold voltage ($V_{th}$) of −1.5 V, the drain current (Id) increases nearly linearly as gate voltage ($V_g$) increases, indicating that neither the mobility (μ) is degrading at high electrical field nor the contact resistance is limiting the current conduction. A nanomesh transistor according to some embodiments may exhibit clearly linear I-V characteristics at low drain voltage ($V_d$) region, also indicating Ohmic S/D contacts (graph 810). The current saturation at high $V_d$ region also matches with typical long-channel transistor behaviors. The OFF-state currents may not be influenced by the nanomesh fill factor, while the ON-state current may increase with the fill factor, resulting in a small increase of the $I_{ON}/I_{OFF}$ ratio (see, for example, FIGS. 19 and 20). Graph 815 presents extracted effective mobilities as a function of the gate voltage for nanomeshes with different fill factors according to some embodiments. The transistor extracted parameter for the mobility calculation are summarized in the following Table 1:

| Fill factor of Si nanomesh transistor | $V_d$ (V) | $V_{th}$ (V) | Operating region of Si nanomesh transistor |
|---|---|---|---|
| 33.7% | 0.1 | −1.79 | Linear |
| 35.6% | 0.1 | −1.84 | Linear |
| 40.7% | 0.1 | −1.81 | Linear |
| 44.5% | 0.1 | −1.82 | Linear |
| 52.3% | 0.1 | −1.81 | Linear |

The mobility of Si nanomeshes may first increase at low values of $V_g$, then reach a peak, and finally decrease, consistent with a typical screening-scattering transition. Peak effective mobilities may be achieved from 50 cm²/V·s to 95 cm²/V·s at fill factor from 33.7% to 52.3%. The mobilities of Si nanomeshes may be smaller than values expected from a 'dilution' perspective from the full-film Si transistor (with μ~615 cm²/V·s) (see, for example, FIG. 21), the mobility of Si nanomeshes may be calculated from multiplying the mobility of Si full film by the Si nanomesh fill factor. The mobilities of nanomesh structures according to some embodiments may be significantly higher compared to conventional stretchable semiconductors, where the mobilities are typically much less than 10 cm²/V·s.

Figure 9:
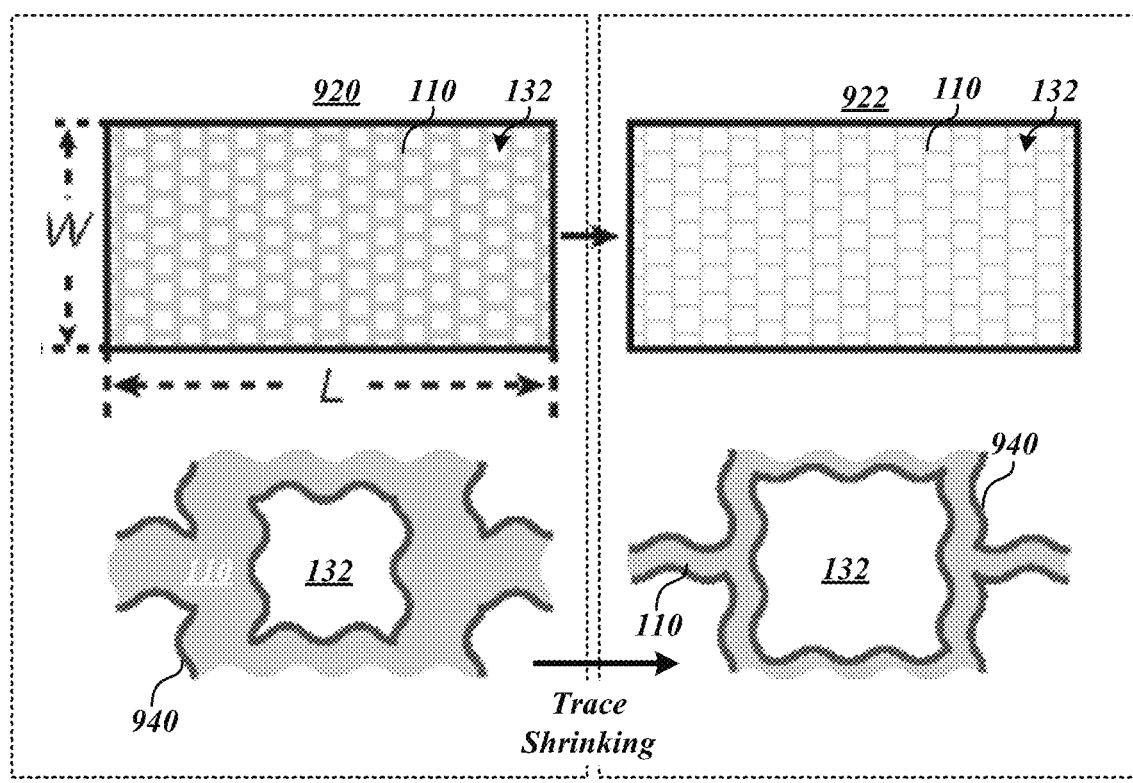
FIG. 9 depicts a schematic model of semiconductor nanomesh materials according to some embodiments.

FIG. 9 depicts a schematic model of semiconductor nanomesh materials according to some embodiments. As shown in FIG. 9, nanomesh material 922 may be formed from nanomesh material 920 via trace shrinking. Assuming the same or essentially the same nanomesh openings 130 for the entire W×L area, the sidewall circumference 940 around nanomesh material 110 may be proportional to the square root of the mesh-opening area, which is a natural consequence of the theorems about similar figures. The sidewall area (s), equal to the sidewall circumference times the film thickness, will therefore also be proportional to the square root of (1−x).

Figure 10:
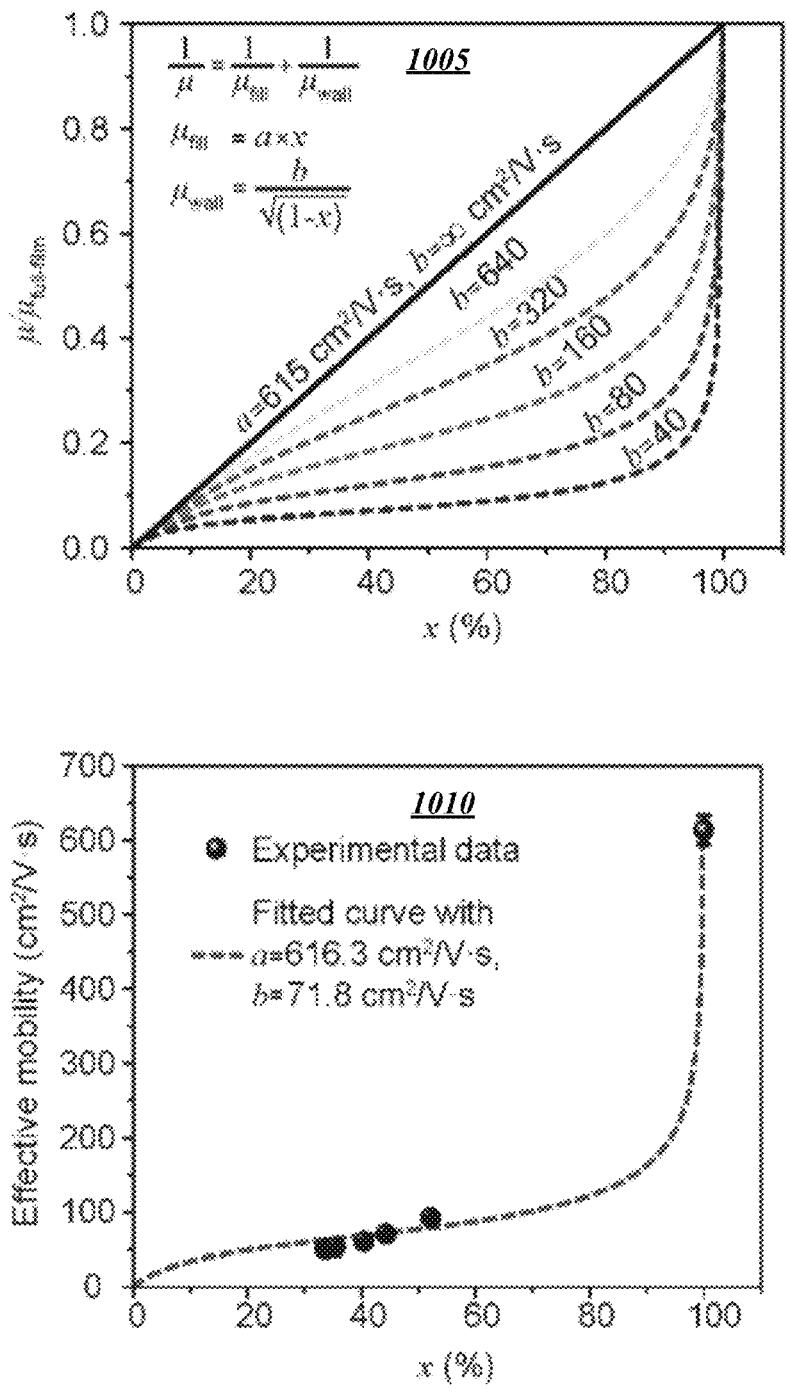
FIG. 10 depicts graphs of mobility characteristics of Si nanomesh materials according to some embodiments.

FIG. 10 depicts graphs of mobility characteristics of Si nanomesh materials according to some embodiments, for example, structures 920 and 922 of FIG. 9. Regarding graph 1005 of FIG. 10, the dependence of nanomesh mobility on fill factor may be affected by fractional material ($\mu_{fill}$) and scattering of trace sidewall ($\mu_{wall}$) using "Matthiessen's Rule". For example, $\mu_{fill}$ and $\mu_{wall}$ are approximated as a×x and b/√(1−x) respectively, where a and b are materials and surface dependent prefactors. Regarding graph 1010 of FIG. 10, experimental effective mobility of semiconductor nanomeshes may be fitted as a function of fill factor using the analytical model here. A fitting curve with a=616.3 cm⁻¹/V·s and b=71.8 cm²/V·s matches closely with experimental data.

Referring to FIG. 9, models 920 and 922 may be used to demonstrate the structure-property relationship of Si nanomeshes (for instance, with nanomeshes as a new material) regarding their carrier transport properties. The structure of a Si-nanomesh film may be determined by various nanomesh characteristics, such as nanomesh pattern, trace width, sidewall area, fill factor, and/or film (e.g., Si or Si/PI) thickness. In general, at least two factors may contribute to the nanomesh mobility: one is the fractional Si material, the other is the surface scattering from the sidewalls of the nanoscale traces. To simplify the analysis, we consider a Si-nanomesh film with a fixed nanomesh pattern and film thickness, while with shrinking trace width. As the trace width decreases, the fractional Si material reduces (i.e., smaller area of 110 for 922). The variable x may be denoted as the fill factor of Si in the W×L channel area, neglecting the scattering from the trace sidewalls, the fractional-material induced mobility ($\mu_{fill}$) may be calculated as a×x to the first order, for example, from the dilution perspective, where a is a constant with a value equal to full film mobility, $\mu_{full-film}$.

On the other hand, there are increasing sidewall areas if the nanomesh trace narrows. Assuming all nanomesh openings have the same shape for in the entire W×L area, the sidewall area (s), equal to the sidewall circumference times the film thickness, will therefore be proportional to the square root of (1−x). If assuming proportional scattering from the sidewall, the sidewall-area induced mobility ($\mu_{wall}$) will then be b/√(1−x), where b is a prefactor related with sidewall surface quality. To include effects from both the fractional material and trace sidewall scattering, we approximate the combination of their influences by using "Matthiessen's Rule:"

$$\frac{1}{\mu} = \frac{1}{\mu_{fill}} + \frac{1}{\mu_{wall}}, \quad (1)$$

where μ is the mobility of the Si nanomesh film. Thus, the dependence of mobility of Si nanomeshes on the Si fill factor can be expressed as:

$$\mu = \frac{abx}{ax\sqrt{1-x} + b}. \quad (2)$$

Graph 1005 plots the relative mobility curves ($\mu/\mu_{full-film}$) as a function of fill factor (x) with different a, b values. When the mobility is only dominated by the fractional material (i.e., b=∞), there is a linear relationship between mobility and fill factor as expected. When considering the sidewall surface scattering (finite b values), the mobility shows a sharp decrease as the fill factor reduces. The more the sidewall surface scattering is (decreasing b value), the faster the drop of the nanomesh mobility will be, especially in the initial decrease in the fill factor.

The analytical model may be validated via fitting the model to the experimental dependence of peak effective mobility on fill factor x. The curve extracted from Equation (2) in graph 1010 with a=616.3 cm²/V·s and b=71.8 cm²/V·s is in good agreement with the experimental data. This agreement strongly encourages the concept of incurring trace sidewall scattering for carrier transport studies in nanomesh films. This modeling result also indicates that the mobility can be further improved by future surface passivation, which can reduce the trace sidewall surface scattering. The mobility of circular nanomesh transistors shows a similar trend with the ones made by the In grain boundary lithography, and an analytical model with a=615.9 cm²/V·s and b=94.6 cm²/V·s well fits with the experimental results, validating our approach (see, for example, FIG. 22).

Experiment I: Stretchability

In some embodiments, nanomesh structures may demonstrate mechanical stretchability of transferred Si nanomeshes on an elastomer substrate, such as PDMS. For example, an automated stretcher (for example, the customized stretcher depicted in FIG. 23) may be used to characterize the stretchability of nanomesh structures according to some embodiments. In one experiment, a test was performed at a low speed of 0.05 mm/s to avoid any abrupt strain caused by the high stretching speed.

Figure 11A:
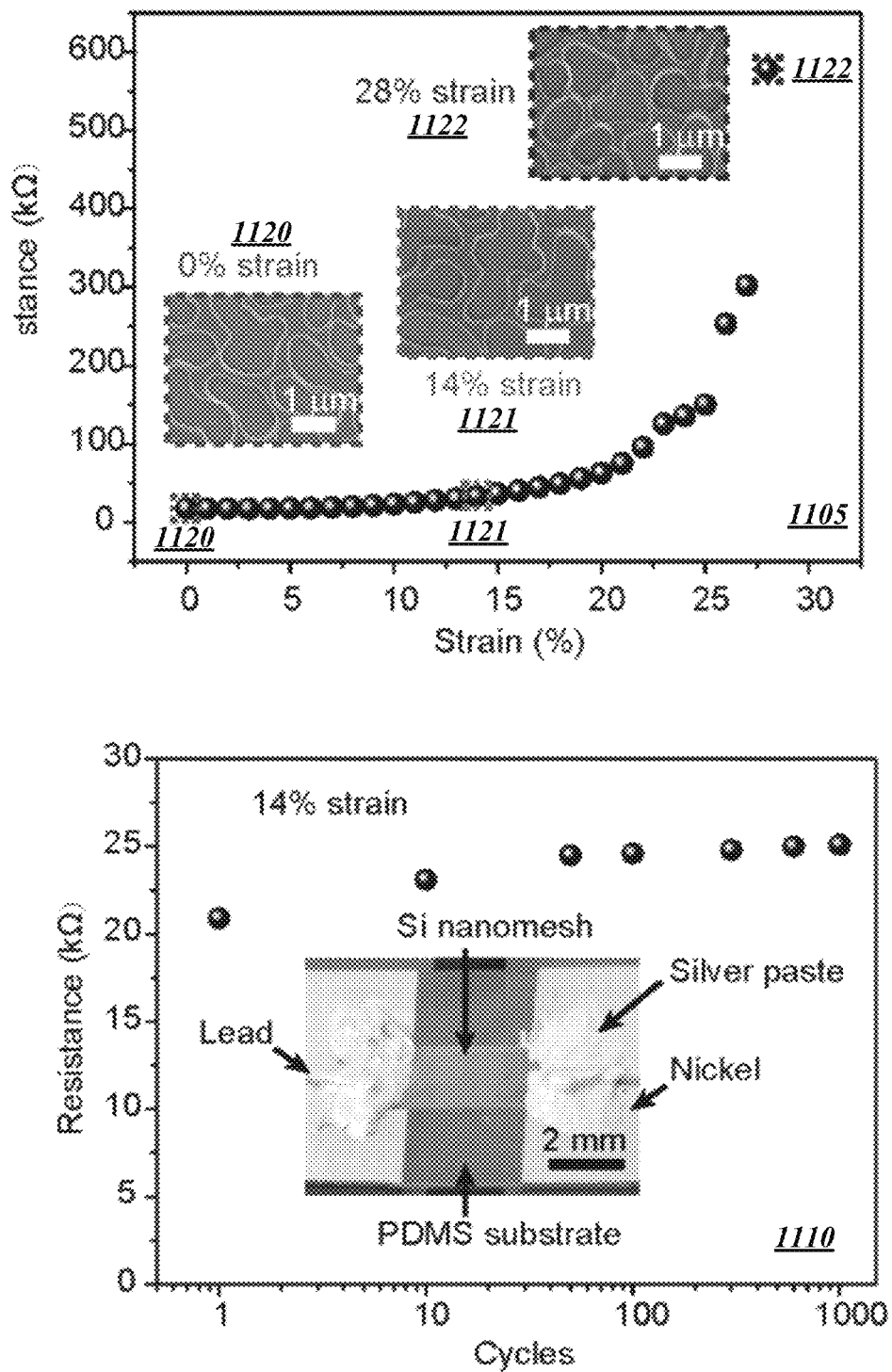
FIGS. 11A and 11B depict graphs of sheet resistance characteristics of Si nanomesh materials according to some embodiments.
Figure 11B:
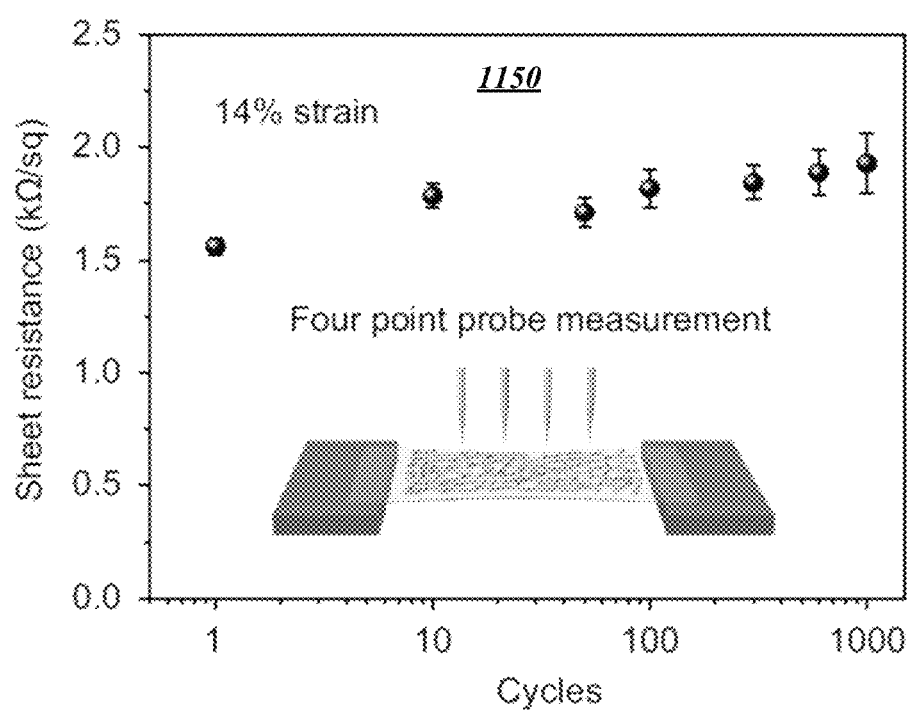
Figure 23:
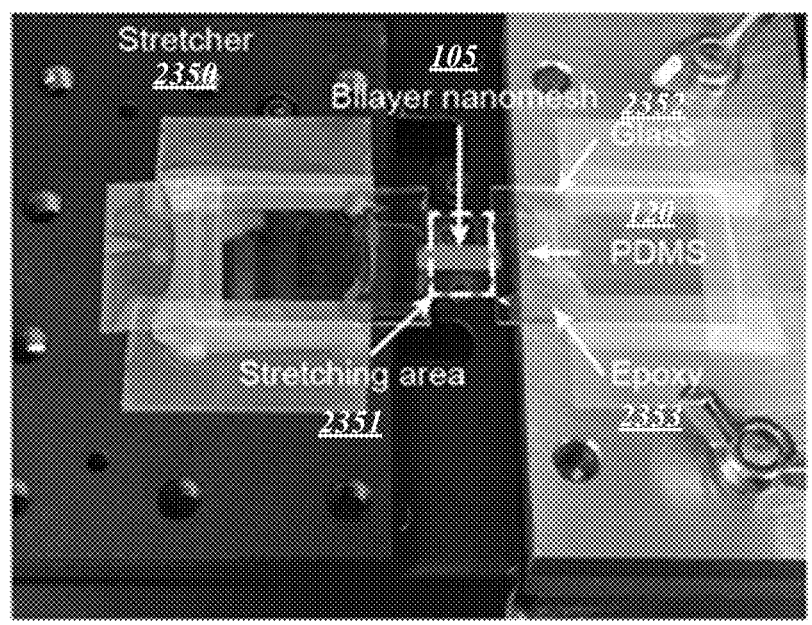
FIG. 23 depict an experimental setup of a stretchability test of Si nanomesh structures according to some embodiments.

FIGS. 11A-11D depict results of Experiment I. For example, FIG. 11A depicts graphs of sheet resistance characteristics of Si nanomesh materials according to some embodiments, and FIG. 11B depicts a graph of maximum strain information of Si nanomesh materials according to some embodiments. FIG. 23 depict an experimental setup of a stretchability test for Experiment I according to some embodiments. Other types of stretching devices and/or configurations known in the art may also be used.

Referring to FIG. 11A, therein is depicted graph 1105 of sheet resistance of a bilayer nanomesh film (Si/PI nanomeshes on a 1-mm-thick PDMS substrate) with 33.7% fill factor as a function of tensile strain, with "BT" referring to "before transfer." SEM images (inset) of 0% 1120, 14% 1121, and 28% 1122 strain states, showing the microscale stretching behavior of the nanomeshes. The sheet resistance increases nonlinearly as tensile strain with two obvious tendencies. When the strain is smaller than ~20%, the sheet resistance remains nearly unchanged, while at higher strain state a fast increase in resistance occurs. At a small global strain, the nanomesh traces can deform within the plane without exceeding the Si fracture strain limit. Indeed, as shown in the inset SEM image of 14% 1121, nearly no cracks or broken traces are observed. The resistance slightly increases in the strain range of 10% to 20%, which may arise from the piezoresistive effect of Si. When the global strain is large, nonreversible breaking of Si traces occurred, as observed from the SEM image of the nanomeshes at a 28% strain state 1122.

In some embodiments, low- or lower-strain stretching is reversible and repeatable. For example, graph 1110 of FIG. 11A and 1150 of FIG. 11B depict changes in sheet resistance versus stretching cycles (up to 1000 cycles) of bilayer nanomeshes according to some embodiments (33.7% fill factor). Graphs 1110 and 1150 shows the fatigue test with up to 1000 stretching cycles at a 14% strain. No obvious fatigue from the sheet resistance change is observed after the cyclic stretching up to 1000 cycles. Since Si usually fractures at ~1% strain, this 14% stretchability in nanomesh structures according to some embodiments has achieved an order of magnitude increase of the performance of conventional materials.

Figure 11C:
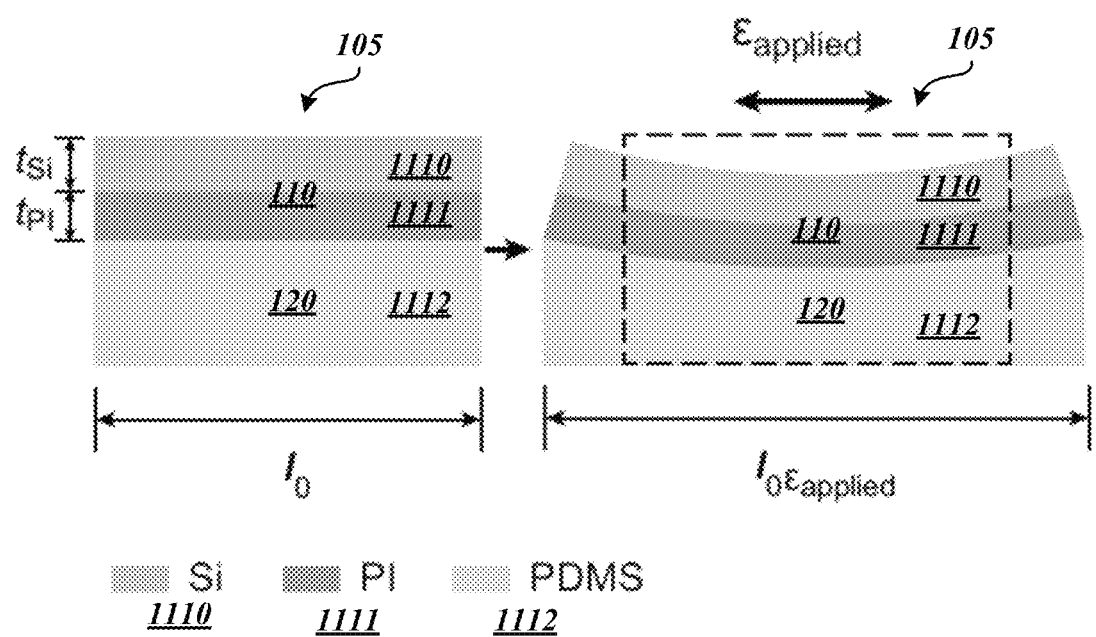
FIG. 11C depicts a schematic mechanics model of an Si/PI bilayer of a nanomesh structure according to some embodiments.
Figure 11D:
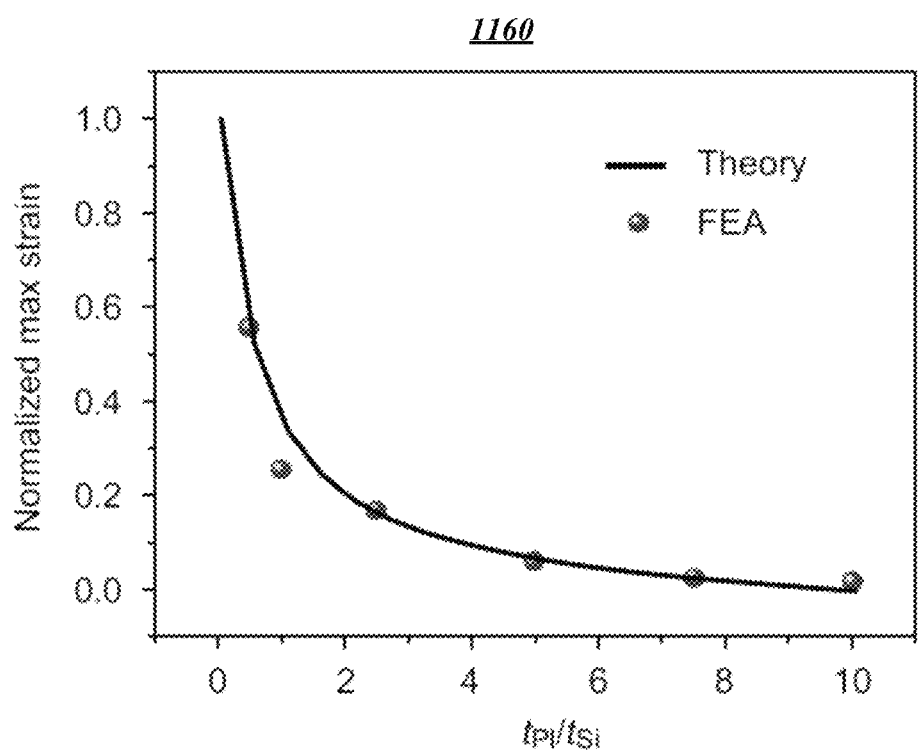
FIG. 11D depicts a graph of maximum strain information of nanomesh materials according to some embodiments.

Referring to FIG. 11C, therein is depicted a schematic mechanics model of an Si/PI bilayer of a nanomesh structure according to some embodiments. An applied strain extends the bottom of the PI layer from the original length of $L_0$ to the deformed length of $L_{0\varepsilon applied}$. As shown in FIG. 11C, both theoretical and finite element analysis (FEA) models may be developed to reveal the advantageous mechanical stretchability of the bilayer Si/PI nanomesh structures according to some embodiments. The models may consist of a Si layer 1110 of thickness $t_{Si}$, a PI layer 1111 of the thickness $t_{PI}$, and a PDMS substrate 1112 that is assumed to be very soft and infinitely thick as compared to the PI or the Si layers 1110 and 1111, respectively. The loading is considered to be at the bottom of PI layer 1111 where an applied strain $\varepsilon_{applied}$ extends the original length $l_0$ to the deformed length of $L_{0\varepsilon applied}$. As $L_0$ approaches zero, this model gives the effects of a localized strain. For the theoretical model, the interactions between the PDMS and the bilayer structure may be neglected, and the bilayer structure may be modeled as a composite beam (equivalent tensile stiffness $K_{eff}$, bending stiffness $B_{eff}$, and the neutral axis position $h_N$ can be obtained analytically). The strain in the structure consists of the membrane and bending stress, and the total maximum strain is found to be at the interface between the Si and the PI layers, with the normalized magnitude of:

$$\frac{\varepsilon_{max}}{\varepsilon_{max0}} = 1 - \frac{t_{PI}}{t_{Si}}\left(\frac{h_N}{t_{Si}} + \frac{12 B_{eff}}{K_{eff} h_N t_{Si}}\right)^{-1} \quad (3)$$

where $\varepsilon_{max0}$ is the maximum strain in Si layer 1111 when $t_{PI}=0$. Referring to FIG. 11D, therein is depicted a graph of maximum strain information of nanomesh materials according to some embodiments. In FIG. 11D, graph 1160 illustrates a comparison between the results given by Equation (3) (solid line) and the results given by a 2D finite element model that considers the PDMS substrate, adopting the experimental data of $E_{Si}$=160 GPa, $E_{Si}$=0.22, $E_{PI}$=2.5 GPa, $E_{PI}$=0.3. The analytical model predicts the maximum strain in the Si layer very well. Graph 1160 also shows that a thicker PI layer significantly reduces the strain in the silicon layer, thereby promoting stretchability. For example, when $t_{PI}$=10·$t_{Si}$, the maximum strain in the silicon is reduced by ~50 times as compared with a structure without the PI layer. This stretchability enhancement in the bilayer nanomesh structure is because, among other things, the PI nanomesh can prevent the strain localization and pin the deformation in the Si traces to make stress uniform.

Figure 12:
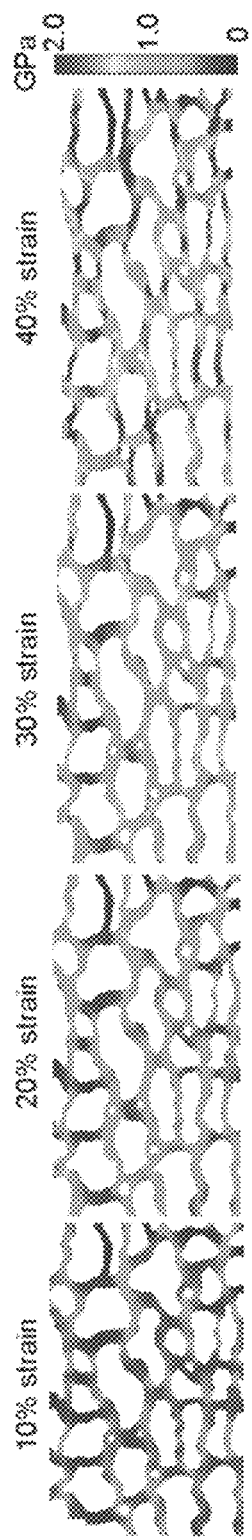
FIG. 12 depicts an finite element analysis (FEA) model simulation of a nanomesh material according to some embodiments.

FIG. 12 depicts an finite element analysis (FEA) model simulation of a nanomesh material according to some embodiments. As shown in FIG. 12, The FEA model with $t_{Si}$=145 nm and $t_{PI}$=300 nm further revealS the strain-stress behavior of the Si nanomeshes. When the nanomeshes are stretched, the stress is distributed in the entire bilayer nanomeshes. Due to the spring-like nano traces, the average stress in the nanomesh film is modest (less than 1 GPa) even at a 20% strain, consistent with experimental results. With the global strain increasing (for example, to 40% strain), the local stress of some traces in the parallel direction becomes greater than its fracture stress of ~2 GPa, leading to possible fractures and a sharp, non-reversible increasing of resistance. This FEA analysis evidently reveals that nanoscale spring-like traces of nanomesh materials according to some embodiments may effectively endure large global strain, for example, in semiconductor nanomeshes.

The engineering strain was utilized to characterize the stretchability. The strain (e) can be calculated as $$e = \frac{\Delta L}{L} = \frac{l - L}{L},$$

where L and l are the length of stretchable area in the original and stretching status, respectively. Each stretching cycle consists of one stretching immediately followed by one releasing movement. The test was performed at a low speed of 0.05 mm/s to avoid the external effects caused by the high stretching speed. After the transfer process, the UV-$O_3$ plasma treated the back side of the PDMS substrate. Two glass pieces fixed the two ends of the PDMS substrate with the nanomesh film by the Si—O bonding, and a 1-cm-wide gap in between the glasses allowed for stretching tests. The sheet resistance during stretching was measured by using a four point probe method.

Experiment II: Method of Forming Si Nanomeshes

Figure 13:
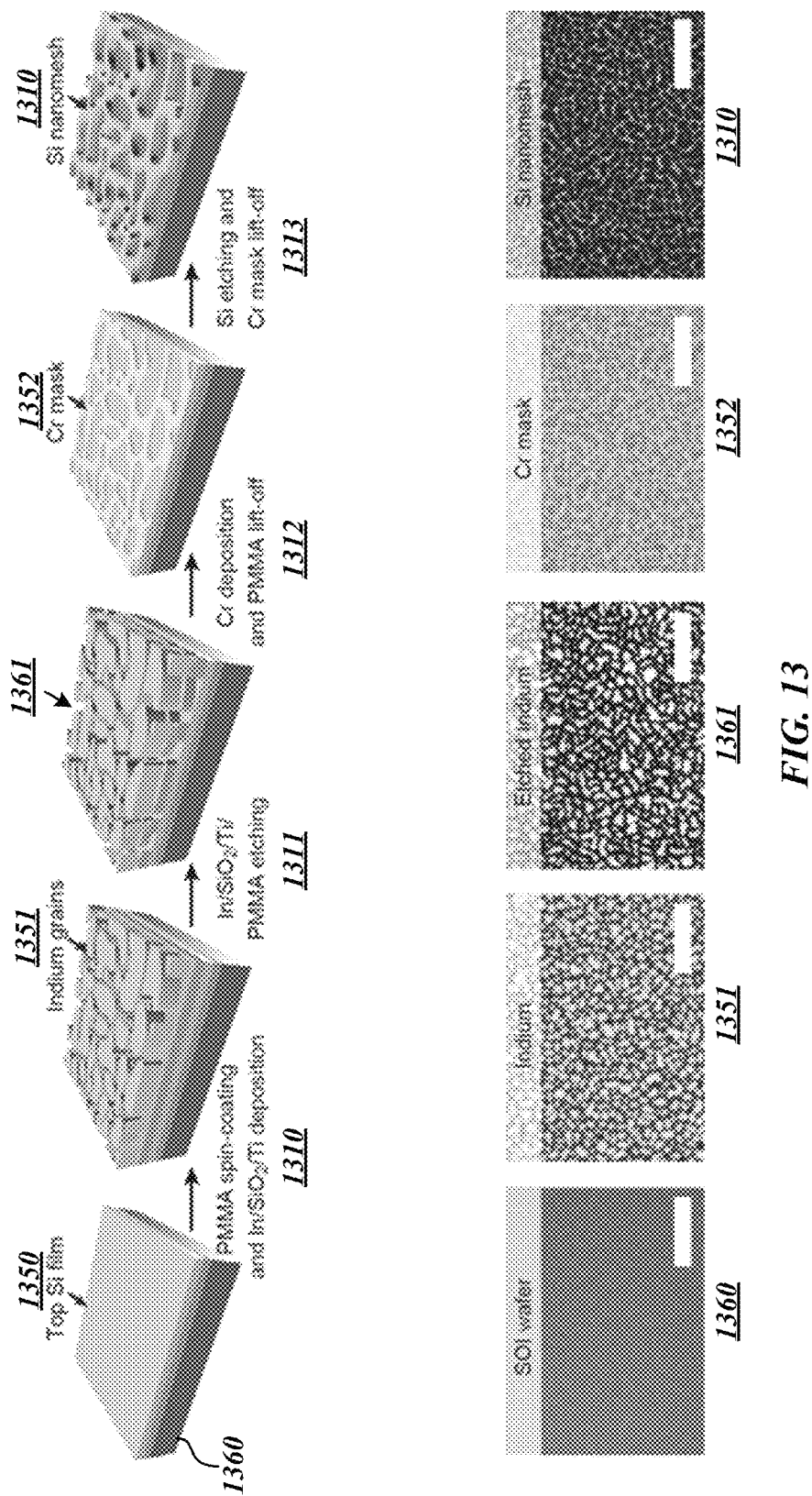
FIG. 13 depicts a detailed Si nanomesh forming process on source wafers according to some embodiments.

FIG. 13 depicts a detailed Si nanomesh forming process on source wafers according to some embodiments. As shown in FIG. 13, the nanomesh patterning started with a silicon-on-insulator (SOI) wafer 1360 which was commercially available (SIMOX SOI, distributed by University Wafer). The SOI wafer consisted of a top Si layer 1350 that was single-crystalline Si with (100) crystal orientation, lightly p-type doped with a doping concentration of $1 \times 10^{14}$ cm$^{-3}$ and a thickness of 145 nm. The buried oxide layer was 120 nm thick, and the handle wafer was 750 µm thick. In principle, the Si nanomeshes can be achieved through various lithography processes, including electron-beam (e-beam) lithography, stepper lithography, In grain boundary lithography, and anodized-aluminum-oxide template lithography. In step 1310, a Poly(methyl methacrylate) (PMMA) thin film with 500 nm thickness was first coated the pre-cleaned SOI wafer. Electron beam (e-beam) evaporation then yielded a 2-nm-thick titanium (Ti) adhesion layer and 20-nm-thick SiO$_2$ thin film on the PMMA layer. This PMMA layer was to serve as a lift-off resist under the to-be-deposited In grains and the Ti/SiO$_2$ layer is for a better wetting of In to form irregular grains instead of circular ones. E-beam evaporation then yielded an In film with a thickness of 250 nm, followed by a 20% HNO$_3$ wet etching to control the gap between grains.

The In grain etching process 1311 was an isotropic process, including surface oxidation and acidic etching. The acidic etching was a fast process while the surface oxide layer prevented In from etching away, making the etching rate always under control. Here the In grains 1351 defined the pattern of the final Si nanomeshes, while the gaps between In grains after the HNO$_3$ etching process determined the Si trace width. After forming clear In grain boundaries, inductive coupled plasma (ICP) (Plasma-Therm, 790) dry etching processes selectively etched the SiO$_2$ and PMMA layer to expose the SOI wafer under the grain boundary. E-beam evaporation then formed a 30-nm-thick Cr film on the exposed Si. In a lift off process 1312, immersing the wafer in acetone dissolved the PMMA and lift off the In grains and Ti/SiO$_2$ wetting layer, with the help of a gentle sonication. The steps mentioned above formed a Cr nanomesh mask 1352 on top of the SOI wafer, which served as the master pattern to achieve the final Si nanomeshes. In an Si etching and Cr mask lift-off process 1313, an ICP Si dry etching process then etched the Si in the SOI wafer with Cr nanomesh mask. Finally a Cr etchant (Transene, 1020AC) removed the Cr nanomesh mask, leaving only Si nanomeshes on the SOI wafer. The Cr mask may be removed immediately to avoid the oxidation of Cr. The thickness of top Si layer therefore defined the Si nanomesh thickness.

Experiment III: Fabrication of Si Nanomeshes Transistors

First, plasma-enhanced chemical vapor deposition (PECVD) (SPTS, LpX) deposited a 300 nm-thick SiO$_2$ film on the SOI wafer as the doping mask. Conventional photolithography then defined the source and drain patterns, followed by the SiO$_2$ film etching by a trifluoromethane (CHF$_3$) plasma in ICP system. The diffusion of phosphorus (Filmtronics, P451) then occurred at 950° C. for 5 min in a tube furnace (Thermco, MB-71 Mini Brute Tube). The doping concentration here was quantified from 4-point-probe measurements to be $\sim 6 \times 10^{19}$ cm$^{-3}$. After the doping, immersing the wafer in 20% HF for 10 s etched SiO$_2$ mask film. The process of patterning Si nanomeshes in Experiment II was then conducted on the post-doping SOI wafer. After the nanomesh formation, photolithography then defined the transistor area, and an ICP etching with sulfur hexafluoride (SF$_6$) gas isolated the transistor. E-beam evaporation then yielded Ni layer with a thickness of 100 nm to form contacts with heavily doped Si parts, with photolithography defining the source and drain regions. Immersing the wafer in 30 wt. % iron (III) chloride (FeCl$_3$) solution for 20 s finally isolated Ni contact and completed the back-gated transistor fabrication.

The effective mobility of Si-nanomesh transistors fabricated according to some was extracted from their transfer characteristics curves by using the equation, $$\mu = \frac{L}{WC_{ox}(V_g - V_{th} - 0.5V_d)} \frac{\partial I_d}{\partial V_g}, \quad (4)$$

where $C_{ox}$ represents the gate capacitance which is calculated from a parallel plate model. Note that the W here is defined as the overall device width, instead of the sum of the Si nanomesh trace widths, since we regard the Si-nanomesh film effectively as a new material.

Before the transfer process, a high temperature doping step doped the top Si layer in the SOI wafer to a doping concentration of $\sim 5 \times 10^{18}$ cm$^{-3}$. The aforementioned soft lithography process then patterned the doped Si into nanomeshes on the SOI wafer. To facilitate the transfer, a 300-nm-thick PI film was coated on the post-nanomeshing SOI wafer, followed by curing at 250° C. for 90 min. Immersing the wafer in 20% HF for 1 min then undercut the buried oxide layer through the ultrathin PI layer. Before the lift-off of the PI layer embedding the Si nanomeshes, e-beam evaporation yielded a thin layer of Ti/SiO$_2$ on the PI film. In parallel, a PDMS elastomer base was mixed at a 10:1 ratio with the curing agent, followed by curing at 80° C. for 1 hour to prepare the PDMS receiving substrate. A 1-mm-thick PDMS substrate with a pre-treatment by UV-O$_3$ plasma for 15 min then picked up the PI layer with Si nanomeshes embedded. After this step, the Si nanomeshes and PI layer were flipped over, resulting that the Si nanomeshes were on top of the PI layer. Finally, an ICP RIE step with O$_2$ plasma patterning the PI layer with Si nanomeshes as the self-aligned etching mask completed the formation of the stretchable Si/PI nanomeshes on PDMS.

Figure 14:
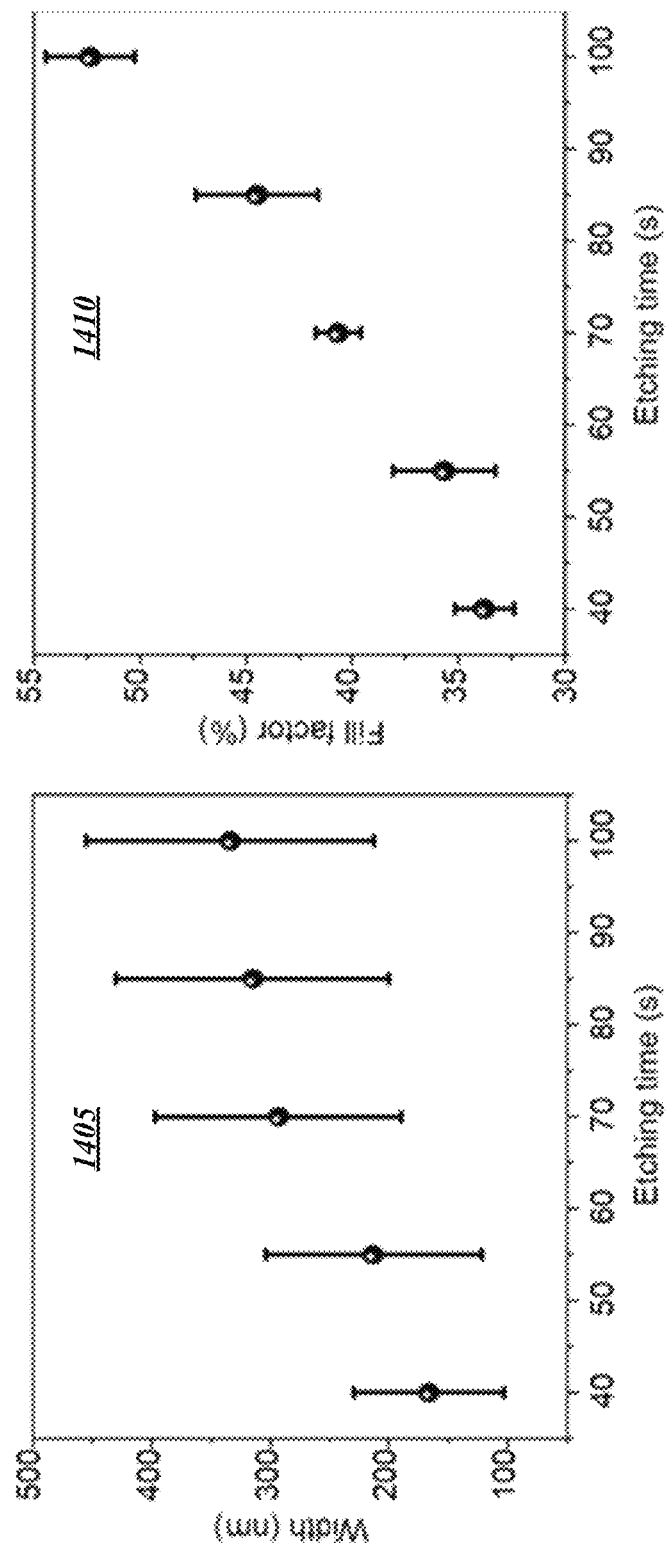
FIG. 14 depicts graphs of width and etching time information for Si nanomesh structures according to some embodiments.

FIG. 14 depicts graphs of width and etching time information for Si nanomesh structures according to some embodiments. More specifically, FIG. 14 depicts graphs 1405 and 1410 illustrating controllability of nanomesh traces based on dependence of nanomeshes with width (graph 1405) and In etching time (1410).

Figure 15:
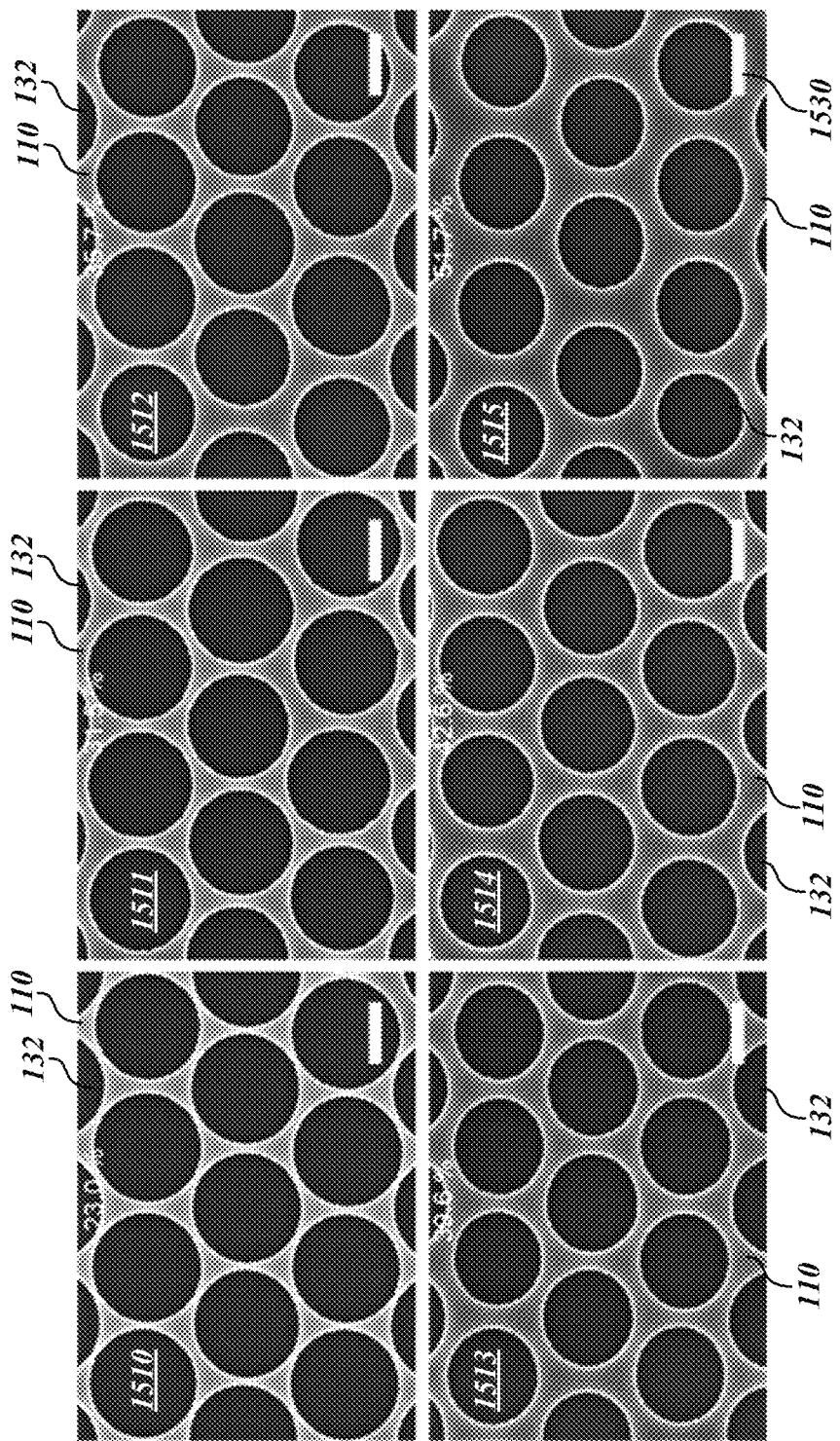
FIG. 15 depicts circular Si nanomesh structures according to some embodiments.
Figure 16:
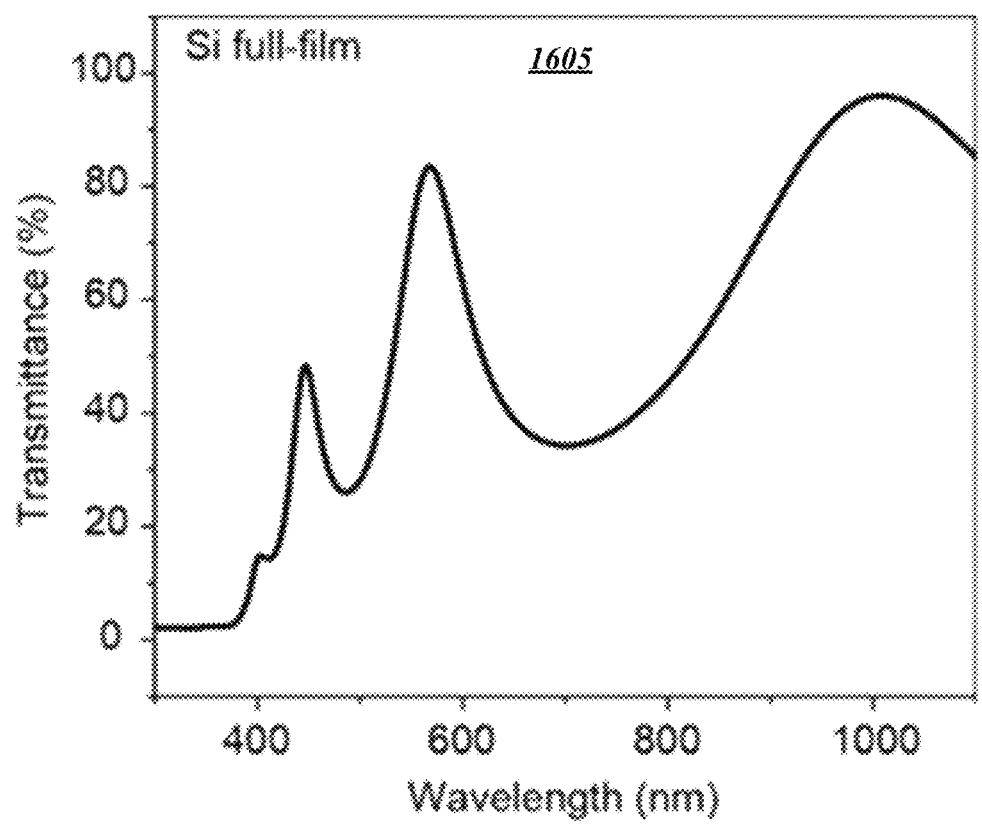
FIG. 16 depicts a graph of transmittance information for Si nanomesh structures according to some embodiments.
Figure 17:
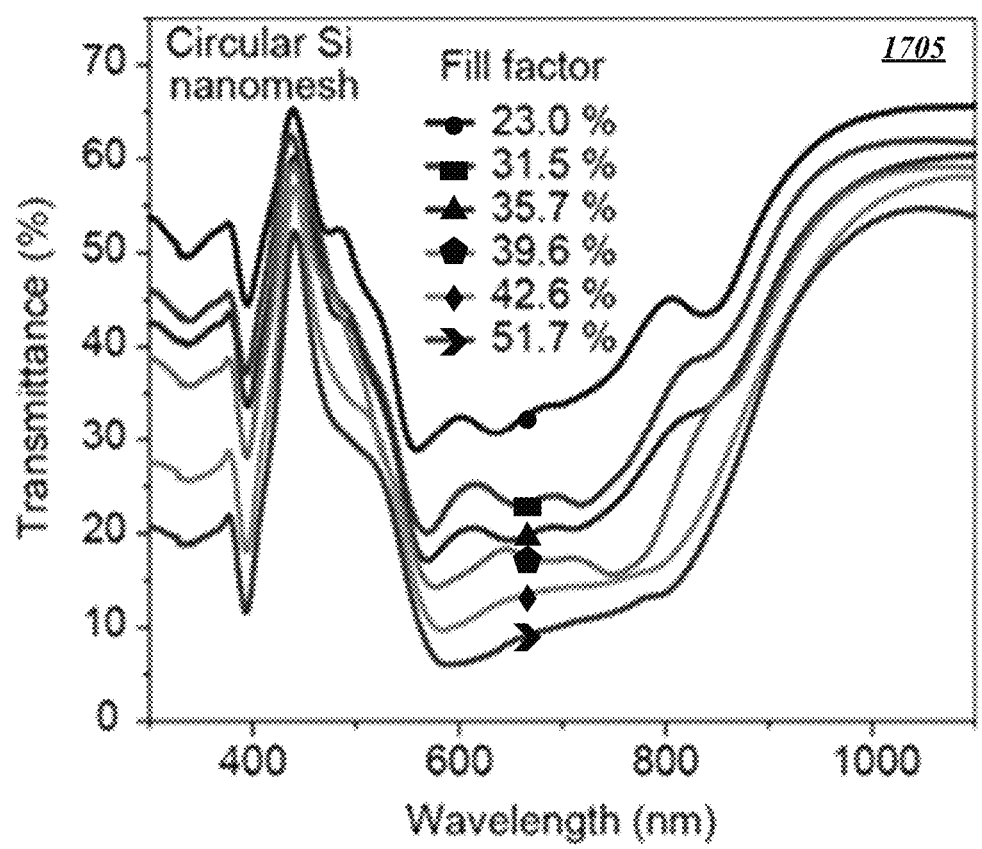
FIG. 17 depicts a graph of transmittance information for circular Si nanomesh structures according to some embodiments.
Figure 18:
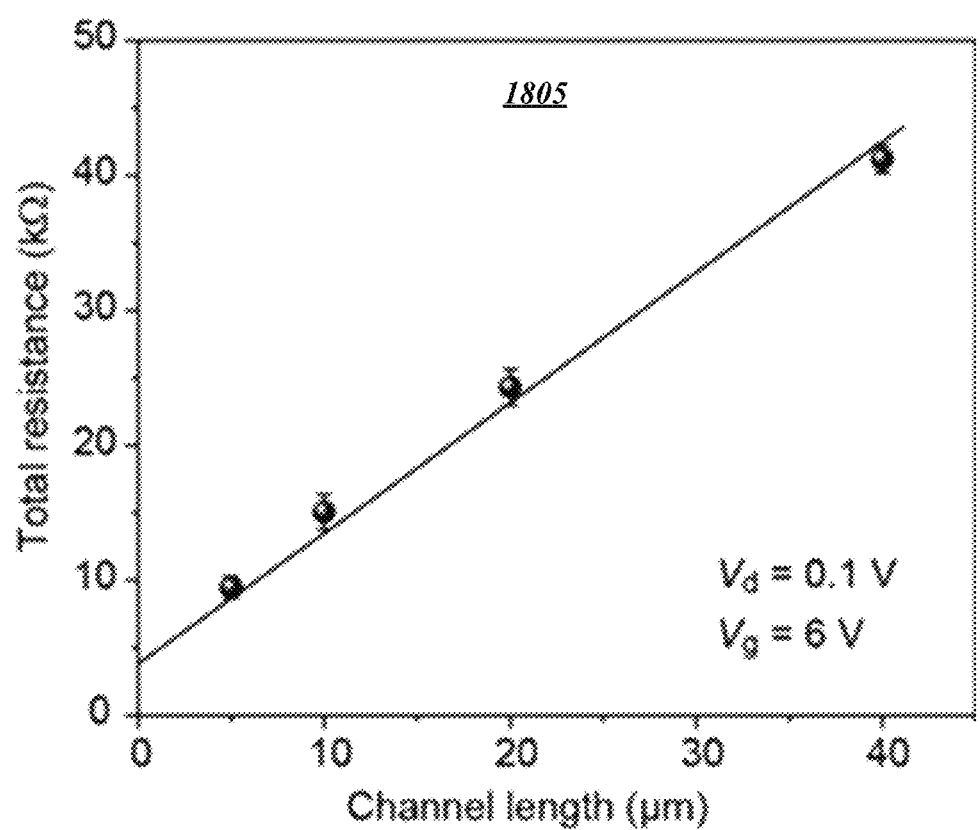
FIG. 18 depicts a graph of transmission line information for Si nanomesh transistors according to some embodiments.

FIG. 15 depicts circular Si nanomesh structures according to some embodiments. More specifically, FIG. 15 depicts SEM images of nanomesh structures 1510-1515 having different fill factors (scale 1530 is 500 nm). FIG. 16 depicts a graph of transmittance information for Si nanomesh structures according to some embodiments. More specifically, FIG. 16 depicts graph 1605 of transmittance spectra of a Si full-film transferred from the same SOI wafer. FIG. 17 depicts a graph 1705 of transmittance information for circular Si nanomesh structures according to some embodiments. FIG. 18 depicts a graph of transmission line information for Si nanomesh transistors according to some embodiments. In FIG. 18, graph 1805 illustrates transmission line information, for example, generated via a transmission line measurement analysis by plotting total resistance with channel length, for nanomesh structures according to some embodiments.

Figure 19:
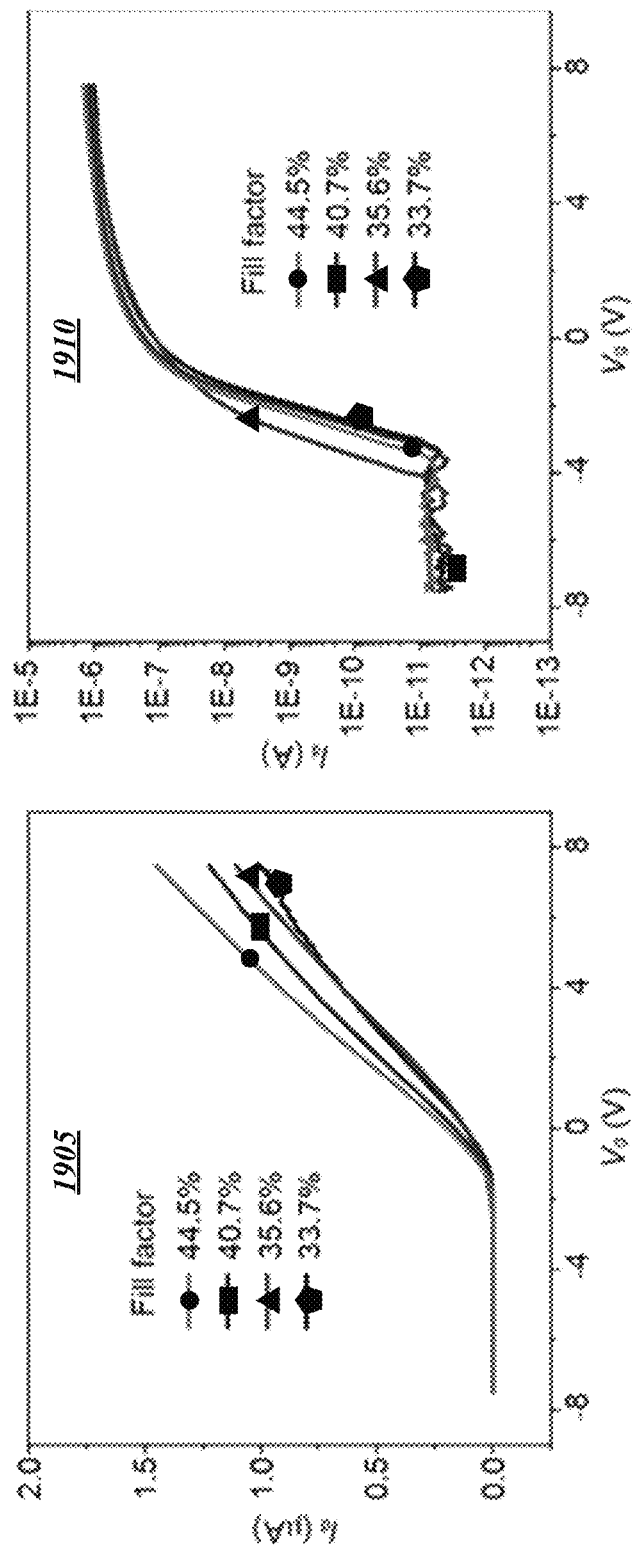
FIG. 19 depict graphs of transport characteristics of Si nanomesh structures according to some embodiments.

FIG. 19 depict graphs of transport characteristics of Si nanomesh structures according to some embodiments. More specifically, FIG. 19 depicts graphs 1905 and 1910 of Transport characteristics of Si nanomeshes with different fill factors. Transfer characteristics on linear scale (graph 1905) and log scale (graph 1910) of the Si nanomesh transistor with different fill factors at a drain voltage of 0.1 V. The channel width and length are 35 µm and 40 µm, respectively.

Figure 20:
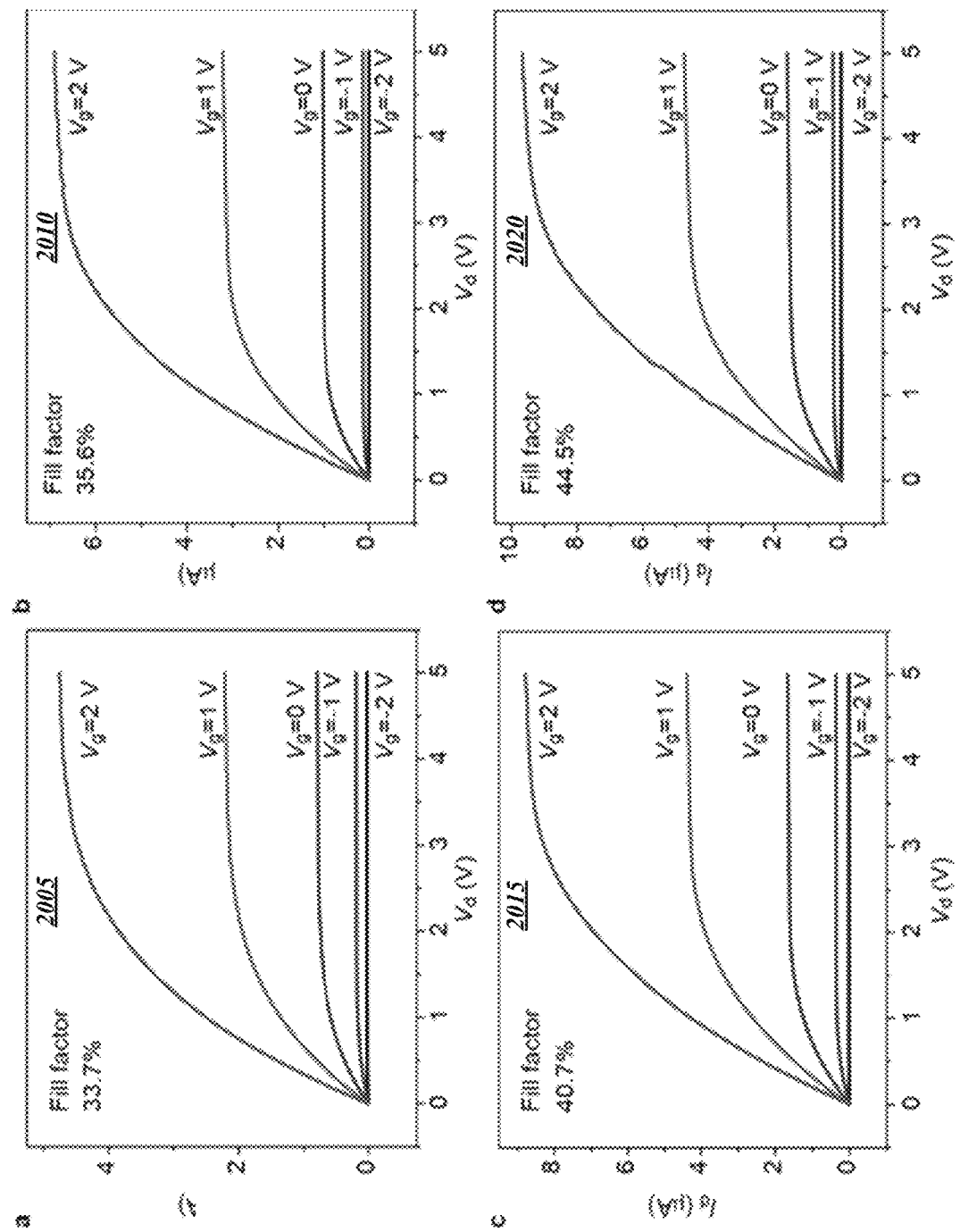
FIG. 20 depicts graphs of output characteristics for Si nanomesh transistors according to some embodiments.

FIG. 20 depicts graphs of output characteristics for Si nanomesh transistors according to some embodiments. In particular, FIG. 20 depicts graphs 2005-2020 of output characteristics of Si nanomesh transistors. Output characteristics of the Si nanomesh transistors with 33.7% (graph 2005), 35.6% (graph 2010), 40.7% (graph 2015), and 44.5% (graph 2020) fill factor at gate voltages from −2 V (bottom) to 2 V (top). The channel width and length are 35 µm and 40 µm, respectively.

Figure 21:
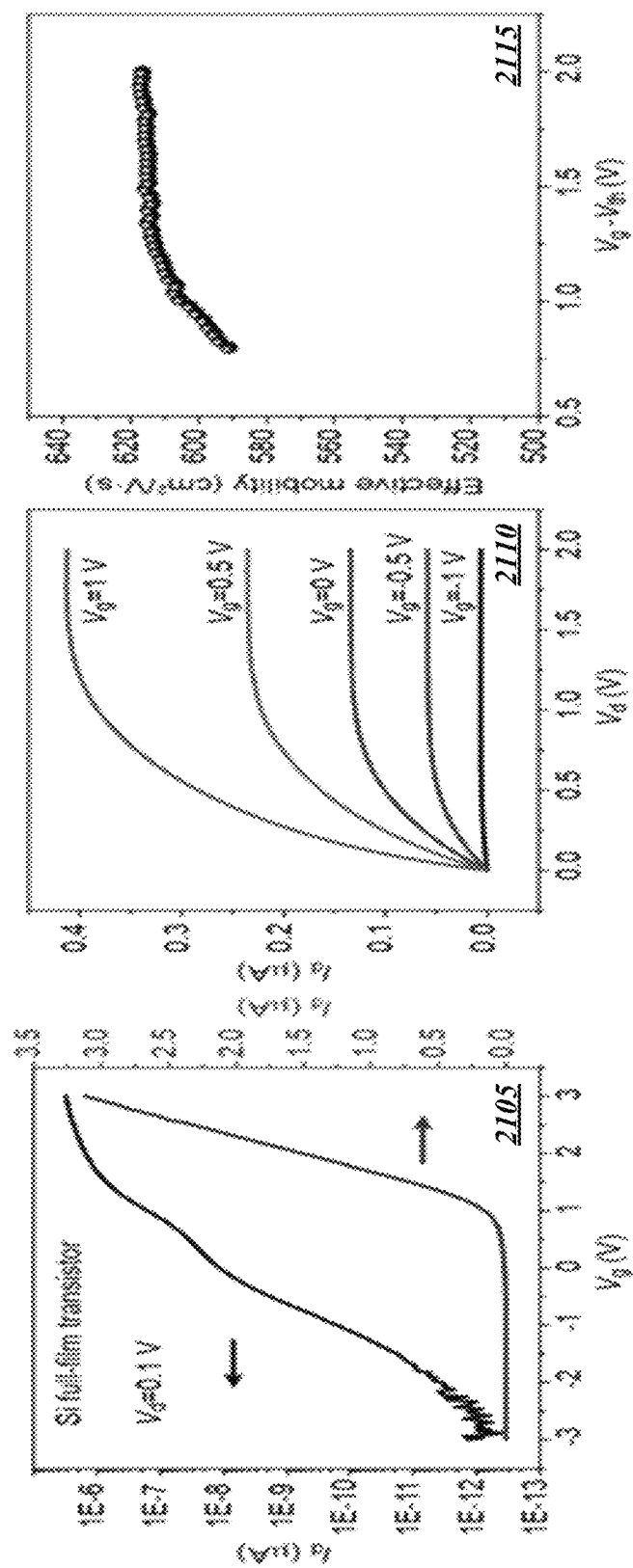
FIG. 21 depicts graphs of transport properties of Si full-film transistors according to some embodiments.

FIG. 21 depicts graphs of transport properties of Si full-film nanomesh transistors according to some embodiments. More specifically, FIG. 21 depicts graphs 2105 and 2110 of transport properties of Si full-film transistor. Transfer characteristics (graph 2105) and output characteristics (graph 2110) of the Si full-film transistor. The channel width and length are 35 µm and 40 µm, respectively. Graph 2115 depicts extracted effective mobility as a function of gate voltage at a drain voltage of 0.1 V.

Figure 22:
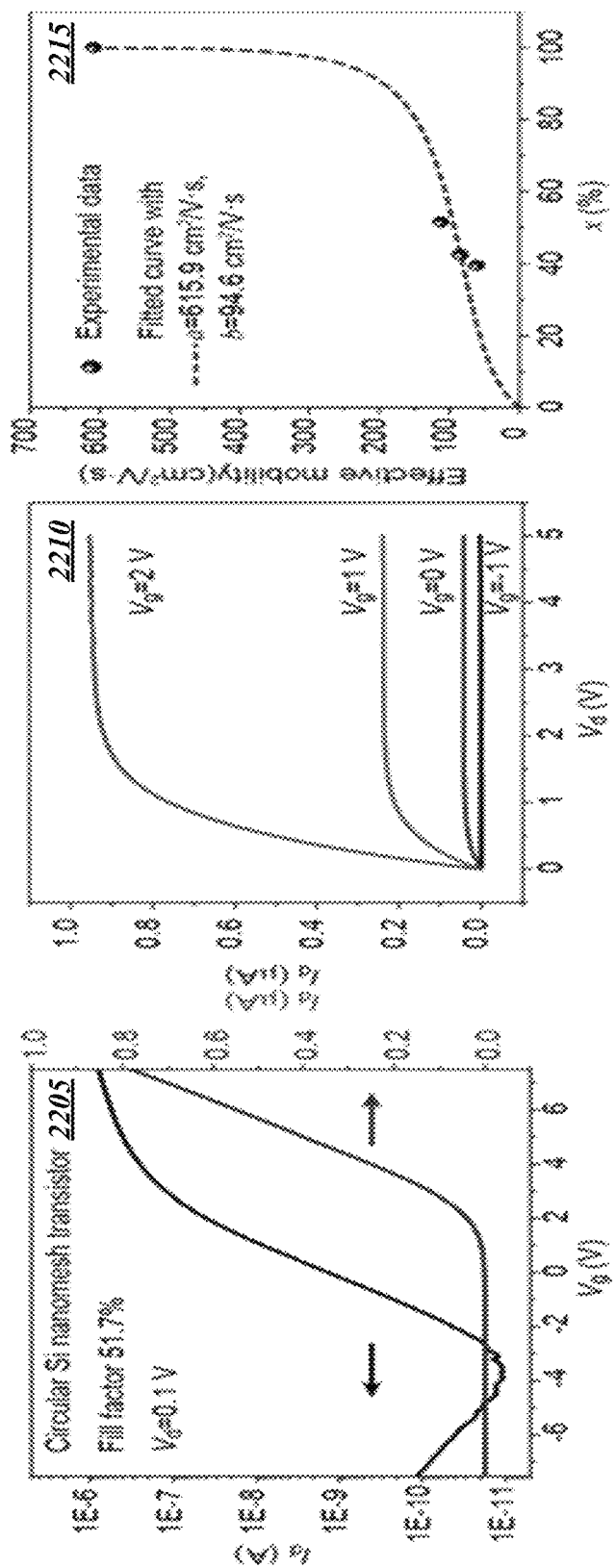
FIG. 22 depicts graphs of transport properties of circular nanomesh transistors according to some embodiments.

FIG. 22 depicts graphs of transport properties of circular nanomesh transistors according to some embodiments. In particular, FIG. 22 depicts graphs 2205 and 2210 of transport properties of the circular Si nanomesh transistor. Transfer characteristics (graph 2205) and output characteristics (2210) of the circular Si nanomesh transistor with 51.7% fill factor. The channel width and length are 35 µm and 40 µm, respectively. Graph 2215 illustrates the dependence of the effective mobility on the circular Si nanomesh fill factor.

FIG. 23 depict an experimental setup of a stretchability test of Si nanomesh structures for Experiment I according to some embodiments. As shown in FIG. 23, the experimental setup may include a stretcher 2350 having a nanomesh structure 105 with PDMS 120 arranged on a stretching area 2351 with glass 2352 and epoxy 2353 materials. Other types of stretching devices and/or configurations known in the art may also be used.

Figure 24:
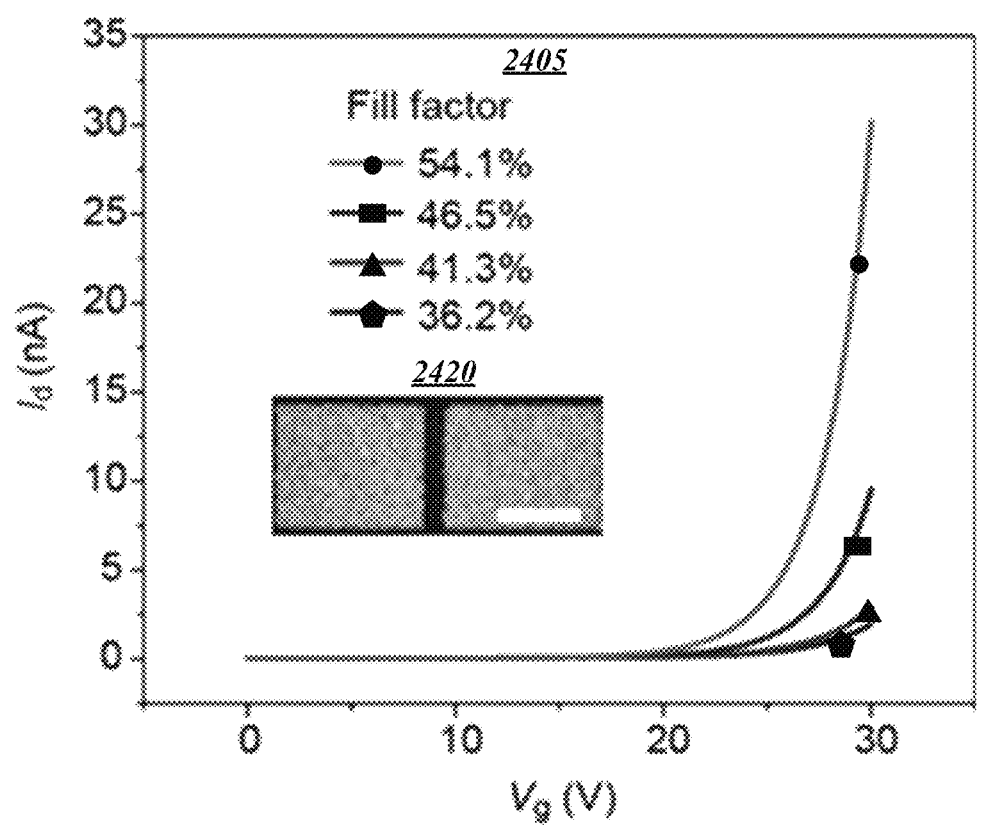
FIG. 24 depicts a graph of transfer characteristics of amorphous Si nanomesh structures according to some embodiments.

FIG. 24 depicts a graph of transfer characteristics of amorphous Si nanomesh structures according to some embodiments. In particular, FIG. 24 depicts graph 2405 of transfer characteristics of the a-Si nanomesh transistors with different fill factors. The channel width and length are 35 µm and 5 µm, respectively. The Vd is 10 V. Inset 2420 is the optical image of the a-Si nanomesh transistor with fill factor of 54.1%. The scale bar is 20 µm. The fabrication process began with depositing a 200-nm-thick a-Si layer on the thermal oxide coated Si wafer by magnetron sputtering. Then, a conventional thermal annealing step annealed the a-Si film at 1,000° C. for 60 min followed by a high temperature doping step at 1,000° C. for 5 min using the spin-on dopant P451. The fabrication process mentioned in the manuscript then yielded the a-Si nanomesh transistors on the thermal oxide coated Si wafer.

Figure 25:
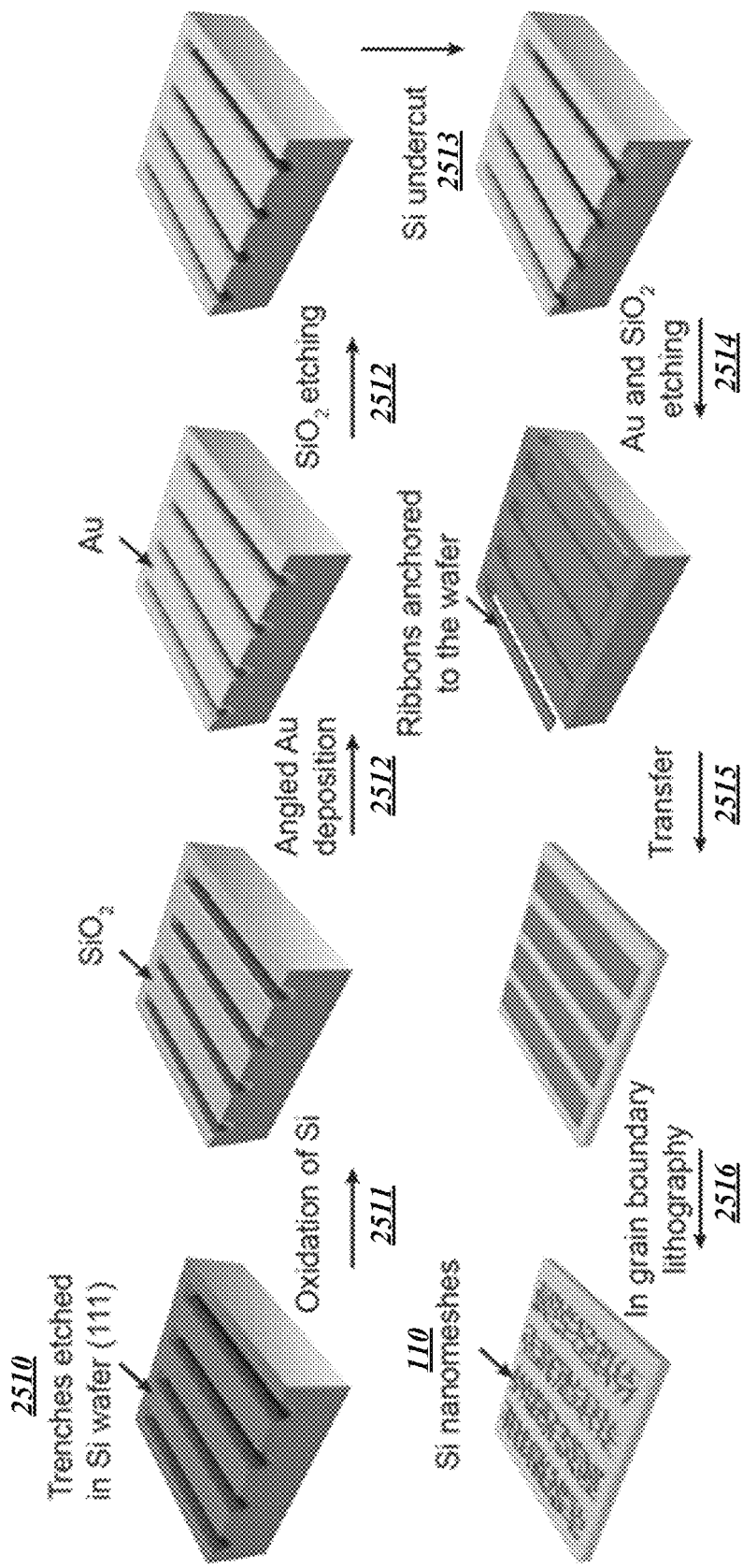
FIG. 25 depicts a schematic illustration of a low-cost nanomesh fabrication process from bulk Si wafers according to some embodiments.

FIG. 25 depicts a schematic illustration of a low-cost nanomesh fabrication process from bulk Si wafers according to some embodiments. More specifically, FIG. 25 depicts fabrication process 2500 for a low-cost Si nanomeshes fabrication method by deriving Si ribbons from bulk wafers. As shown in FIG. 25, fabrication process 2500 may include starting with trenches etched in an Si wafer 2510, oxidation of Si 2511, angled gold (Au) deposition 2512, SiO$_2$ etching 2513, Si undercutting 2514, Au and SiO$_2$ etching 2515, transfer 2516, and In grain boundary lithography 2517 to generate Si nanomeshes 110.

Accordingly, some embodiments may provide nanomesh structures, for example, nanomeshed Si nanomembranes, that are stretchable while with superior carrier transport properties. Devices such as stretchable diodes with large area coverages and/or high densities can be readily achieved, in a way that leverages both metal and semiconductor nanomeshes and conventional microelectronic layout. In addition, design concepts such as the horseshoe and serpentine structures in microscale wavy structures and fractal designs may also apply to nanomeshes structures according to some embodiments for the enhancement of their stretchability. Some embodiments may include enhancements of replacing the SOI process, for example, utilizing deposited amorphous-Si layers as the active material (see, for example, FIG. 24), or transferring Si ribbons from bulk wafers then converting to nanomeshes (see, for example, FIG. 25). Although Si, PI, PDMS, and other materials have been used in examples in the present disclosure, embodiments are not so limited. For example, nanomesh structures and fabrication processes may be applicable to other inorganic materials including, without limitation, GaN, GaAs, Ge, optoelectronic semiconductors (e.g., gallium nitride) and piezoelectric materials (e.g., lead zirconate titanate) to enable stretchability.

In one embodiment, a Si/PI bilayer nanomesh film with a trace width of 100 nm has demonstrated a one time stretchability of up to 25% strain, and robust cyclic stretchability with less than 10% fatigue after 1000 stretching cycles with a constant strain of 14%, which can also maintain a peak effective mobility of 50 cm$^2$/V·s.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A stretchable semiconductor nanomesh structure, comprising:
 a nanomesh formation of semiconductor material comprising a network of traces forming at least one opening between sidewalls of the nanomesh formation material, and
 a substrate configured to support the nanomesh formation material.

2. The stretchable semiconductor nanomesh structure of claim 1, the nanomesh formation material comprising silicon and the substrate comprising an elastomer material.

3. The stretchable semiconductor nanomesh structure of claim 2, the nanomesh formation material comprising a bilayer nanomesh material formed of silicon and Polyimide (PI).

4. The stretchable semiconductor nanomesh structure of claim 2, the elastomer material comprising Polydimethylsiloxane (PDMS).

5. The stretchable semiconductor nanomesh structure of claim 1, the network of traces comprising a web of fully connected sidewalls.

6. The stretchable semiconductor nanomesh structure of claim 1, the nanomesh formation material having a fill factor defined by an occupation percentage of the nanomesh formation material over a defined area, the fill factor less than about 100%.

7. The stretchable semiconductor nanomesh structure of claim 6, the fill factor being about 30% to about 55%.

8. The stretchable semiconductor nanomesh structure of claim 1, the stretchable nanomesh structure having an electron mobility of greater than 10 $cm^2/V \cdot s$ to about 50 $cm^2/V \cdot s$.

9. The stretchable semiconductor nanomesh structure of claim 1, the stretchable nanomesh structure having a one-time stretchability of up to about 25% strain.

10. The stretchable semiconductor nanomesh structure of claim 1, the stretchable nanomesh structure having cyclic stretchability with less than 10% fatigue after 1000 stretching cycles with a constant strain of 14%.

11. An electronic device, comprising:
 a stretchable semiconductor nanomesh structure to provide at least one electrical function for the electronic device, the stretchable nanomesh structure comprising:
  a nanomesh formation material comprising a network of traces forming at least one opening between sidewalls of the nanomesh formation material, and
  a substrate configured to support the nanomesh formation material; and
 an electrical component operably coupled to the stretchable nanomesh structure.

12. The electronic device of claim 11, the nanomesh formation material comprising silicon and the substrate comprising an elastomer material.

13. The electronic device of claim 12, the nanomesh formation material comprising a bilayer nanomesh material formed of silicon and Polyimide (PI).

14. The electronic device of claim 12, the elastomer material comprising Polydimethylsiloxane (PDMS).

15. The electronic device of claim 11, the network of traces comprising a web of fully connected sidewalls.

16. The electronic device of claim 11, the nanomesh formation material having a fill factor defined by an occupation percentage of the nanomesh formation material over a defined area, the fill factor less than about 100%.

17. The electronic device of claim 16, the fill factor being about 30% to about 55%.

18. The electronic device of claim 11, the stretchable nanomesh structure having an electron mobility of greater than 10 $cm^2/V \cdot s$ to about 50 $cm^2/V \cdot s$.

19. The electronic device of claim 11, the stretchable nanomesh structure comprising a transistor.

20. The electronic device of claim 11, the electronic device comprising at least one of a bio-mimetic device, a health monitoring device, a wearable device, a sensor, or a soft robotic device.

* * * * *